United States Patent
Chiba et al.

(10) Patent No.: US 7,592,124 B2
(45) Date of Patent: Sep. 22, 2009

(54) PHOTOSENSITIVE ELEMENT, PHOTOSENSITIVE ELEMENT ROLL, PROCESS FOR THE PREPARATION OF RESIST PATTERN USING THE SAME, RESIST PATTERN, RESIST PATTERN LAMINATED SUBSTRATE, PROCESS FOR THE PREPARATION OF WIRING PATTERN AND WIRING PATTERN

(75) Inventors: Tasuo Chiba, Hitachi (JP); Tatsuya Ichikawa, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/281,371

(22) Filed: Nov. 18, 2005

(65) Prior Publication Data

US 2006/0078824 A1     Apr. 13, 2006

Related U.S. Application Data

(63) Continuation of application No. 10/018,690, filed as application No. PCT/JP00/04028 on Jun. 21, 2000, now abandoned.

(30) Foreign Application Priority Data

Jun. 24, 1999 (JP) ............................. 1999-177587
Feb. 29, 2000 (JP) ............................. 2000-52990

(51) Int. Cl.
*B32B 5/16* (2006.01)
*B32B 27/36* (2006.01)
*G03F 7/004* (2006.01)

(52) U.S. Cl. .................. 430/270.1; 430/281.1; 430/322; 430/311; 428/327; 428/323; 428/480

(58) Field of Classification Search .............. None
See application file for complete search history.

(56) References Cited

U.S. PATENT DOCUMENTS

| 4,337,308 | A | 6/1982 | Franke |
| 5,648,159 | A | 7/1997 | Sato |
| 6,207,247 | B1 | 3/2001 | Morita |
| 6,207,345 | B1 * | 3/2001 | Kimura et al. ........... 430/271.1 |
| 2005/0064057 | A1 * | 3/2005 | Morita ................... 425/192 R |

FOREIGN PATENT DOCUMENTS

| JP | 47-469 | 1/1972 |
| JP | 54-12215 B2 | 5/1979 |
| JP | 55-501072 A | 12/1980 |
| JP | 56-040824 A | 4/1981 |
| JP | 59-097138 A | 6/1984 |
| JP | 59-216141 A | 12/1984 |
| JP | 61-31855 B2 | 7/1986 |
| JP | 61-213843 | 9/1986 |
| JP | 63-197942 A | 8/1988 |
| JP | 01-096640 | 4/1989 |
| JP | 01-096641 | 4/1989 |
| JP | 1-221735 A | 9/1989 |
| JP | 2-230149 A | 9/1990 |
| JP | 04-223471 | 8/1992 |
| JP | 05-080499 | 4/1993 |
| JP | 07-169671 | 7/1995 |
| JP | 08-309251 | 11/1996 |
| JP | 09-255797 | 9/1997 |
| JP | 10-083079 | 3/1998 |
| JP | 10-180866 | 7/1998 |
| JP | 10-333328 | 12/1998 |

* cited by examiner

*Primary Examiner*—John A McPherson
*Assistant Examiner*—Daborah Chacko Davis

(57) ABSTRACT

There are disclosed a photosensitive element comprising a support film which comprises a biaxially oriented polyester film and a photosensitive resin composition layer formed on one surface of the polyester film;
wherein a resin layer containing fine particles is formed on the opposite surface of the support film to which the photosensitive resin composition layer is formed, and said photosensitive resin composition comprises
(A) a binder polymer having a carboxyl group,
(B) a photopolymerizable compound having at least one polymerizable ethylenically unsaturated group in the molecule, and
(C) a photopolymerization initiator,
a photosensitive element roll, a process for the preparation of a resist pattern using the same, the resist pattern, a resist pattern-laminated substrate, a process for the preparation of a wiring pattern and the wiring pattern.

23 Claims, 3 Drawing Sheets

Axis direction

Drop 10 cm

Axis direction

Axis direction

Y piece
X piece

Axis direction

PHOTOSENSITIVE ELEMENT, PHOTOSENSITIVE ELEMENT ROLL, PROCESS FOR THE PREPARATION OF RESIST PATTERN USING THE SAME, RESIST PATTERN, RESIST PATTERN LAMINATED SUBSTRATE, PROCESS FOR THE PREPARATION OF WIRING PATTERN AND WIRING PATTERN

This application is a continuation of application Ser. No. 10/018,690, filed Dec. 20, 2001, which is a National Phase Application in the United States of International Patent Application No. PCT/JP00/04028, filed Jun. 21, 2000, which claims priority on Japanese Patent Application No. 177587/1999, filed Jun. 24, 1999 and Japanese Patent Application No. 52990/2000, filed Feb. 29, 2000, the entire disclosures of which are incorporated herein by reference.

TECHNICAL FIELD

This invention relates to a photosensitive element, a photosensitive element roll, a process for the preparation of a resist pattern using the same, the resist pattern, a resist pattern laminated substrate, a process for the preparation of a wiring pattern and the wiring pattern.

PRIOR ART

In the field of a preparation of a printed wiring board, precision processing of a metal, etc., a photosensitive resin composition and a photosensitive element have been widely used as a resist material to be used for etching, plating, etc.

A photosensitive element generally comprises three layers of a light-transmissive support film, a photosensitive resin composition layer and a protective film. As a method of using the same, there may be mentioned a method in which a protective film is firstly peeled off, the element is bonded by pressure (laminated) so as to directly contact with a photosensitive resin layer, a negative film which has been subjected to patterning is adhered onto a light-transmissive film, active light (ultraviolet rays are frequently used) is irradiated (exposed), and then, unnecessary portions are removed by spraying an organic solvent or an aqueous alkaline solution to form (develop) a resist pattern. A method which employs an aqueous alkaline solution as a developing solution has been highly demanded in view of an environmental problem.

In recent years, electronic equipment has been promoted to be small sized and light weighted. A printed wiring board has been also required to make the circuit fine, a resist pattern is made finer line and high resolution of a photosensitive element has been required. However, such demands cannot be satisfied by the conventional photosensitive element comprising the three-layer structure. That is, it is exposed through a light-transmissive support film so that a thickness of the film is required to be thin as much as possible to obtain high resolution. On the other hand, the support is required to have a self-retaining property with a certain extent to accomplish a role as a support for a photosensitive resin composition to be coated. It is generally required to have a thickness of 15 to 25 µm. Thus, it is the present status that the demand of high resolution cannot be accomplished when a light-transmissive support film with the conventional grade is used.

To these demands, various attempts have been made to accomplish high resolution. For example, there is a method in which a support film is peeled off before exposure and a negative film is directly adhered onto a photosensitive resin composition layer. In general, the photosensitive resin composition layer has an adhesive property with a certain extent so as to adhere to a substrate material. Thus, when the method is directly applied to, the negative film and the photosensitive resin composition layer are adhered whereby the problems arise that the negative film is difficultly peeled off so that operatability is lowered, the negative film is stained by the photosensitive resin or sensitivity is lowered due to inhibition by oxygen in air.

Thus, as an attempt to improve the above method, there has been proposed a method in which a photosensitive resin composition layer is provided with two or more layers and a layer directly contacting with the negative film is made non-adhesive layer (see Japanese Provisional Patent Publications (Kokai) No. Sho. 53-82322 (1978), No. Hei. 1-221735 (1989), No. Hei. 2-230149 (1990), etc.). Japanese Provisional Patent Publication (Kokai) No. Sho. 53-82322 corresponds to Japanese Patent Publication (Kokoku) No. Sho. 61-31855 (1986). However, this method requires troublesome operation to make a multi-layered photosensitive resin composition layers and has no effect on sensitivity.

Also, as the other method, an attempt of providing an intermediate layer on the photosensitive resin composition layer to solve these problems has been described in, for example, Japanese Patent Publications (Kokoku) No. Sho. 54-12215 (1979) and Sho. 56-40824 (1981), Japanese Provisional Patent Publications No. Sho. 55-501072 (1980), No. Sho. 47-469 (1972), No. Sho. 59-97138 (1984), No. Sho. 59-216141 (1984) and No. Sho. 63-197942 (1988), etc. However, in either of these methods, an intermediate layer must be provided between a support film and a photosensitive resin composition layer so that coating must be carried out twice, and handling of a thin intermediate layer is difficult.

An object of the present invention is to provide a photosensitive element excellent in side wall flatness of a resist pattern, flatness at an upper surface of the same, resolution, adhesiveness, alkaline developability, productivity and operatability, and having less number of mouse bites.

An object of the present invention is to provide a photosensitive element excellent in side wall flatness of a resist pattern in addition to the above effects.

An object of the present invention is to provide a photosensitive element excellent in resolution in addition to the above effects.

Another object of the present invention is to provide a photosensitive element excellent in dimensional stability at the time of lamination in addition to the above effects.

Further object of the present invention is to provide a photosensitive element excellent in film strength after hardening the resist in addition to the above effects.

Still further object of the present invention is to provide a photosensitive element excellent in peeling property in addition to the above effects.

Still further object of the present invention is to provide a photosensitive element excellent in plating resistance in addition to the above effects.

Still further object of the present invention is to provide a photosensitive element excellent in adhesiveness in addition to the above effects.

Still further object of the present invention is to provide a photosensitive element excellent in cold flow property at storage in addition to the above effects.

Another object of the present invention is to provide a photosensitive element roll excellent in side wall flatness of a resist pattern, flatness at an upper surface of the same, resolution, adhesiveness, winding deviation during shipping, productivity and operatability, and having less number of mouse bites.

A further object of the present invention is to provide a process for preparing a resist pattern excellent in side wall flatness of a resist pattern, flatness at an upper surface of the same, resolution, adhesiveness, productivity and operatability, and having less number of mouse bites.

A further object of the present invention is to provide a resist pattern excellent in side wall flatness of a resist pattern, flatness at an upper surface of the same, resolution, adhesiveness, productivity and operatability, and having less number of mouse bites.

A further object of the present invention is to provide a resist pattern laminated substrate excellent in side wall flatness of a resist pattern, flatness at an upper surface of the same, resolution, adhesiveness, winding deviation at transfer, productivity and operatability, and less number of mouse bites.

A further object of the present invention is to provide a process for preparing a wiring pattern excellent in side wall flatness of a resist pattern, electric resistance and appearance of lines.

A further object of the present invention is to provide a wiring pattern excellent in side wall flatness of a resist pattern, electric resistance and appearance of lines.

DISCLOSURE OF THE INVENTION

The present invention relates to a photosensitive element comprising a support film which comprises a biaxially oriented polyester film and a photosensitive resin composition layer formed on one surface of the polyester film, wherein a resin layer containing fine particles is formed on the opposite surface of the support film to which the photosensitive resin composition layer is formed, and said photosensitive resin composition comprises (A) a binder polymer having a carboxyl group,
(B) a photopolymerizable compound having at least one polymerizable ethylenically unsaturated group in the molecule, and
(C) a photopolymerization initiator.

Also, the present invention relates to a photosensitive element having a layer of a photosensitive resin composition on a support film, which comprises having a heat shrinkage ratio to the lateral direction of the support film at 200° C. for 30 minutes being 0.00 to 4.00% and said photosensitive resin composition comprises (A) a binder polymer having a carboxyl group,
(B) a photopolymerizable compound having at least one polymerizable ethylenically unsaturated group in the molecule, and
(C) a photopolymerization initiator.

The present invention also relates to the above photosensitive element in which the heat shrinkage ratio to the lateral direction of the support film at 150° C. for 30 minutes is 0.00 to 0.20%.

The present invention also relates to the above photosensitive element in which the heat shrinkage ratio to the lateral direction of the support film at 105° C. for 30 minutes is 0.00 to 0.20%.

Also, the present invention relates to a photosensitive element having a layer of a photosensitive resin composition on a support film, which comprises having a heat shrinkage ratio to the lateral direction of the support film at 150° C. for 30 minutes being 0.00 to 0.20% and said photosensitive resin composition comprises (A) a binder polymer having a carboxyl group,
(B) a photopolymerizable compound having at least one polymerizable ethylenically unsaturated group in the molecule, and
(C) a photopolymerization initiator.

The present invention also relates to the above photosensitive element in which the heat shrinkage ratio to the lateral direction of the support film at 105° C. for 30 minutes is 0.00 to 0.20%.

Moreover, the present invention relates to a photo-sensitive element having a layer of a photosensitive resin composition on a support film, which comprises having a contact angle (°) of the support film by water satisfying the following numerical formula (1):

(Contact angle at $X$ surface)/(Contact angle at $Y$ surface)>1.1     (1)

X surface: a surface of the support film to which the photosensitive resin composition is coated and dried,
Y surface: a surface of the support film opposite to the surface to which the photosensitive resin composition is coated, and said photosensitive resin composition comprises
(A) a binder polymer having a carboxyl group,
(B) a photopolymerizable compound having at least one polymerizable ethylenically unsaturated group in the molecule, and
(C) a photopolymerization initiator.

Furthermore, the present invention relates to the above photosensitive element in which the support film is a support film comprising a resin layer containing fine particles being laminated on one surface of a biaxially oriented polyester film, and the photosensitive resin composition layer is provided at the opposite surface of the support film to which the resin layer is formed.

The present invention also relates to the above photosensitive element in which an average particle size of the fine particles is 0.01 to 5.0 μm.

The present invention also relates to the above photosensitive element in which a thickness of the resin layer containing fine particles is 0.05 to 5.0 μm.

The present invention also relates to the above photosensitive element in which a haze of the support film is 0.01 to 5.0%.

The present invention also relates to the above photosensitive element in which a heat shrinkage ratio in the longitudinal direction of the support film at 105° C. for 30 minutes is 0.30 to 0.60%.

The present invention also relates to the above photosensitive element in which a heat shrinkage ratio in the longitudinal direction of the support film at 150° C. for 30 minutes is 1.00 to 1.90%.

The present invention also relates to the above photosensitive element in which a heat shrinkage ratio in the longitudinal direction of the support film at 200° C. for 30 minutes is 3.00 to 6.50%.

The present invention also relates to the above photosensitive element in which a weight average molecular weight of (A) the binder polymer having a carboxyl group is 20,000 to 300,000.

The present invention also relates to the above photosensitive element in which an acid value of (A) the binder polymer having a carboxyl group is 50 to 300 mg KOH/g.

The present invention also relates to the above photosensitive element in which (B) the photopolymerizable compound is a bisphenol A type (meth)acrylate compound.

The present invention also relates to the above photosensitive element in which (C) the photopolymerization initiator is 2,4,5-triaryl imidazole dimer.

The present invention also relates to the above photosensitive element in which formulation amounts of Components (A), (B) and (C) are 40 to 80 parts by weight of Component (A) based on 100 parts by weight of Component. (A) and Component (B) in total, 20 to 60 parts by weight of Component (B) based on 100 parts by weight of Component (A) and Component (B) in total, and 0.01 to 20 parts by weight of Component (C) based on 100 parts by weight of Component (A) and Component (B) in total.

Moreover, the present invention relates to a photo-sensitive element roll in which the above photosensitive element is wound up or rolled around a core.

The present invention also relates to a photosensitive element roll in which the photosensitive element is wound up around a core, wherein a total height of winding deviation at the-edge surface of the photosensitive element roll after naturally dropping the photosensitive element roll five times from the height of 10 cm to the collision surface so that the axis direction of the core becomes perpendicular to the collision surface is 1 mm or less.

The present invention also relates to a process for preparing a resist pattern which comprises laminating the above photosensitive element to a substrate for forming a circuit so that the photosensitive resin composition layer is closely contacted to the substrate, irradiating imagewisely active light to photocure the exposed portion, and removing an unexposed portion by development.

The present invention also relates to a resist pattern prepared by the above preparation process.

The present invention also relates to the above resist pattern in which unevenness on the side surface of the resist pattern is 0 to 3.0 μm.

The present invention also relates to the above resist pattern in which a number of unevenness larger than 3.0 μm on the center line of the side surface of the resist pattern is 0 to 5/4 mm.

The present invention also relates to the above resist pattern in which a mathematical average roughness ($R_a$) on the side surface of the resist pattern is 0 to 2.0 μm.

The present invention also relates to the above resist pattern in which a maximum height ($R_y$) on the side surface of the resist pattern is 0 to 3.0 μm.

The present invention also relates to a resist pattern comprising a maximum height ($R_y$) on the side surface of the resist pattern of 0 to 3.0 μm.

The present invention also relates to the above resist pattern in which a width of the resist pattern is 1 μm or more.

The present invention also relates to the above resist pattern in which a height of the resist pattern is 1 to 150 μm.

The present invention also relates to a resist pattern laminated substrate which comprises the above resist pattern being formed on a substrate for preparing a circuit.

The present invention also relates to a process for preparing a wiring pattern which comprises subjecting the above resist pattern laminated substrate to etching or plating.

The present invention also relates to a wiring pattern prepared by the above process for preparing the wiring pattern.

The present invention also relates to the above wiring pattern in which unevenness on the side surface of the wiring pattern is 0 to 3.0 μm.

The present invention also relates to the above wiring pattern in which a number of unevenness larger than 3.0 μm on the center line of the side surface of the wiring pattern is 0 to 5/4 mm.

The present invention also relates to the above wiring pattern in which a mathematical average roughness ($R_a$) on the side surface of the wiring pattern is 0 to 2.0 μm.

The present invention also relates to the above wiring pattern in which a maximum height ($R_y$) on the side surface of the wiring pattern is 0 to 3.0 μm.

The present invention also relates to a wiring pattern comprising a maximum height ($R_y$) on the side surface of the wiring pattern of 0 to 3.0 μm.

The present invention also relates to the above wiring pattern in which a width of the wiring pattern is 1 μm or more.

The present invention also relates to the above wiring pattern in which a height of the wiring pattern is 0.01 to 200 μm.

BEST MODE FOR CARRYING OUT THE INVENTION

Figure 1:
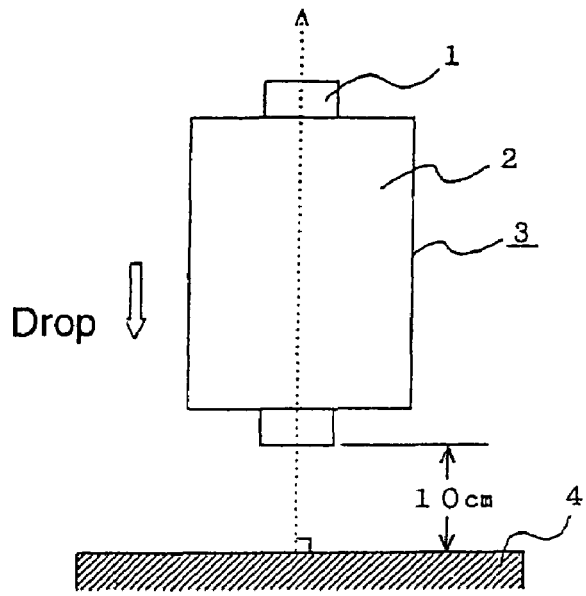
FIG. 1 is a schematic drawing showing a test method of winding deviation of a photosensitive element roll.

In the following, the present invention is explained in detail. Incidentally, a (meth)acrylic acid in the present specification means acrylic acid and methacrylic acid corresponding to the same, a (meth)acrylate means an acrylate and a methacrylate corresponding to the same, and a (meth)acryloyl group means an acryloyl group and a methacryloyl group corresponding to the same.

The photosensitive element of the present invention has four aspects.

The first aspect of the photosensitive element of the present invention resides in a photosensitive element comprising a support film which comprises a biaxially oriented polyester film and a resin layer containing fine particles on one surface of the film, and a layer of a photosensitive resin composition formed on the opposite surface of the support film to which the resin layer is formed, and said photosensitive resin composition comprises (A) a binder polymer having a carboxyl group, (B) a photopolymerizable compound having at least one polymerizable ethylenically unsaturated group in the molecule, and (C) a photopolymerization initiator.

The second aspect of the photosensitive element of the present invention resides in a photosensitive element having a layer of a photosensitive resin composition on a support film, which comprises having a heat shrinkage ratio in the lateral direction of the support film at 200° C. for 30 minutes being 0.00 to 4.00% and said photosensitive resin composition comprises (A) a binder polymer having a carboxyl group, (B) a photo-polymerizable compound having at least one polymerizable ethylenically unsaturated group in the molecule, and (C) a photopolymerization initiator.

The third aspect of the photosensitive element of the present invention resides in a photosensitive element having a layer of a photosensitive resin composition on a support film, which comprises having a heat shrinkage ratio in the lateral direction of the support film at 150° C. for 30 minutes being 0.00 to 0.20% and said photosensitive resin composition comprises (A) a binder polymer having a carboxyl group, (B) a photo-polymerizable compound having at least one polymerizable ethylenically unsaturated group in the molecule, and (C) a photopolymerization initiator.

The fourth aspect of the photosensitive element of the present invention resides in a photosensitive element having a layer of a photosensitive resin composition on a support film, which comprises having a contact angle (°) of the support film with water satisfying the above numerical formula (2), and said photosensitive resin composition comprises (A) a binder polymer having a carboxyl group, (B) a photopolymerizable compound having at least one polymerizable ethylenically unsaturated group in the molecule, and (C) a photopolymerization initiator.

The support film in the first aspect of the photosensitive element of the present invention comprises a resin layer containing fine particles laminated on one surface of a biaxially oriented polyester film. It is preferred that the second photosensitive element, third photosensitive element and fourth photosensitive element use the support film having the above-mentioned structure.

An average particle size of the above fine particles is preferably 0.01 to 5.0 μm, more preferably 0.02 to 4.0 μm, and particularly preferably 0.03 to 3.0 μm. If the average particle size is less than 0.01 μm, workability tends to be lowered, while if it exceeds 5.0 μm, resolution and sensitivity tend to be lowered.

A formulating amount of the above fine particles may vary depending on, for example, a kind of a base resin constituting the resin layer, a kind and an average particle size of the fine particles, physical properties of the support film to be obtained, etc.

As the above fine particles, there may be mentioned inorganic particles such as silica, kaolin, talc, alumina, calcium phosphate, titanium dioxide, calcium carbonate, barium sulfate, calcium fluoride, lithium fluoride, zeolite, molybdenum sulfide, etc.; organic particles such as cross-linked polymer particles, calcium oxalate, etc. In view of transparency, particles of silica are preferred. These fine particles may be used singly or in combination of two or more.

As the base resin to constitute the resin layer containing the above-mentioned fine particles, there may be mentioned, for example, a polyester type resin, a polyurethane type resin, an acrylic type resin, a mixture thereof, a copolymer thereof, etc.

A thickness of the resin layer is preferably 0.01 to 5.0 μm, more preferably 0.05 to 3.0 μm, particularly preferably 0.1 to 2.0 μm, extremely preferably 0.1 to 1.0 μm. If the thickness is less than 0.01 μm, the effects of the present invention cannot likely be obtained, while if it exceeds 5.0 μm, transparency of the polyester film is poor, and sensitivity and resolution tend to be lowered.

The method of laminating the above resin layer on one surface of the above biaxially oriented polyester film is not particularly limited, and may be mentioned, for example, a coating method, etc.

The polyester type resin constituting the above biaxially oriented polyester film may include, for example, aromatic linear polyester comprising an aromatic dicarboxylic acid and a diol as constitutional components, such as polyethylene terephthalate, polybutylene terephthalate, polyethylene naphthalate, etc.; aliphatic linear polyester comprising an aliphatic dicarboxylic acid and a diol as constitutional components; a polyester type resin mainly comprising polyester such as a copolymer of the above materials; etc. These resins may be used singly or in combination of two or more.

Fine particles may be added to the biaxially oriented polyester film to which the above resin layer is laminated. As the fine particles, there may be mentioned, for example, the same fine particles to be contained in the above resin layer. A content thereof is preferably 0 to 80 ppm, more preferably 0 to 60 ppm, particularly preferably 0 to 40 ppm. If the content thereof exceeds 80 ppm, transparency of the polyester film is lowered as a whole, and resolution and sensitivity tend to be lowered.

A method for preparing the above biaxially oriented polyester film is not particularly limited, and there may be used, for example, a biaxially stretching method, etc. Also, after forming the above resin layer on one surface of an unstretched film or a mono-axially stretched film, and the film is further stretched to make a support film.

A thickness of the above biaxially stretched polyester film is preferably 1 to 100 μm, more preferably 1 to 50 μm, particularly preferably 1 to 30 μm, and extremely preferably 10 to 30 μm. If the thickness is less than 1 μm, preparation of the film is not easy and the film cannot easily be commercially available, while if it exceeds 100 μm, cheapness tends to be lowered.

The support film in the second aspect of the photo-sensitive element of the present invention has a heat shrinkage ratio in the lateral direction of the support film at 200° C. for 30 minutes of 0.00 to 4.00%. It is preferred that the first photosensitive element, the third photosensitive element and the fourth photosensitive element use the support film having the heat shrinkage ratio within the above range.

The heat shrinkage ratio in the lateral direction of the above support film at 200° C. for 30 minutes is required to be 0.00 to 4.00%, preferably 0.00 to 3.00%, more preferably 0.00 to 2.00%, particularly preferably 0.00 to 1.50%, extremely preferably 0.00 to 1.30%, most extremely preferably 0.00 to 1.00%. If the heat shrinkage ratio exceeds 4.00%, dimensional precision tends to be lowered.

The support film in the third aspect of the photosensitive element of the present invention has a heat shrinkage ratio in the lateral direction of the support film at 150° C. for 30 minutes of 0.00 to 0.20%. It is preferred that the first photosensitive element, the second photosensitive element and the fourth photosensitive element use the support film having the heat shrinkage ratio within the above range.

The heat shrinkage ratio in the lateral direction of the above support film at 150° C. for 30 minutes is required to be 0.00 to 0.20%, preferably 0.00 to 0.15%, more preferably 0.00 to 0.10%, particularly preferably 0.00 to 0.05%, extremely preferably 0.00 to 0.04%, most extremely preferably 0.00 to 0.03%. If the heat shrinkage ratio exceeds 0.20%, dimensional precision tends to be lowered.

A haze of the above support film is preferably 0.01 to 5.0%, more preferably 0.01 to 3.0%, particularly preferably 0.01 to 2.0%, extremely preferably 0.01 to 1.0%. If the haze is less than 0.01%, preparation of the film is not easy, while if it exceeds 5.0%, sensitivity and resolution tend to be lowered. Incidentally, the haze in the present invention is measured according to JIS K 7105 and, for example, measurement can be carried out by using a commercially available turbidimeter such as NDH-1001DP (available from Nippon Denshoku Kogyo K.K., Japan, trade name), etc.

The heat shrinkage ratio in the lateral direction of the above support film at 105° C. for 30 minutes is 0.00 to 0.20%, more preferably 0.00 to 0.15%, particularly preferably 0.00 to 0.10%, extremely preferably 0.00 to 0.05%. If the heat shrinkage ratio exceeds 0.20%, dimensional precision tends to be lowered.

The support film in the fourth aspect of the photo-sensitive element of the present invention is preferably a support film satisfying the relationship between the contact angle of X surface (the surface of the support film to which the photosensitive resin composition is coated and dried) of the support film and the contact angle of Y surface (the surface of the support film opposite to the surface to which the photosensitive resin composition is coated and dried), of (Contact angle of X surface)/(Contact angle of Y surface)>1.1. It is preferred that the first photosensitive element, the second photosensitive element and the third photosensitive element use the support film satisfying the above relationship of contact angles.

The relationship of the contact angles of the above support film is required to be (Contact angle of X surface)/(Contact angle of Y surface)>1.1, preferably (Contact angle of X surface)/(Contact angle of Y surface)>1.15, more preferably (Contact angle of X surface)/(Contact angle of Y surface) >1.2, particularly preferably (Contact angle of X surface)/ (Contact angle of Y surface)>1.25, most preferably (Contact angle of X surface)/(Contact angle of Y surface)>1.3, extremely preferably (Contact angle of X surface)/(Contact angle of Y surface)>1.35, most extremely preferably (Contact angle of X surface)/(Contact angle of Y surface)>1.4. Also, as the upper limit of (Contact angle of X surface)/(Contact angle of Y surface), it is preferably 5.0, more preferably 4.0, particularly preferably 3.0, extremely preferably 2.0. If the relationship of the contact angles is less than 1.1, dimensional precision tends to be lowered. Incidentally, the contact angles in the present specification can be measured according to JIS R 3257 and measured by a static dropping method.

The heat shrinkage ratio in the longitudinal direction of the above support film at 105° C. for 30 minutes is preferably 0.30 to 0.60%, more preferably 0.35 to 0.55%, particularly preferably 0.40 to 0.50%. If the heat shrinkage ratio is less than 0.30%, the polyester film tends to be brittle, while if it exceeds 0.60%, dimensional change of the photosensitive element tends to be occurred at the time of lamination.

The heat shrinkage ratio in the longitudinal direction of the above support film at 150° C. for 30 minutes is preferably 1.00 to 1.90%, more preferably 1.10 to 1.70%, particularly preferably 1.20 to 1.60%. If the heat shrinkage ratio is less than 1.00%, the polyester film tends to be brittle, while if it exceeds 1.90%, dimensional change of the photosensitive element tends to be occurred at the time of lamination.

The heat shrinkage ratio to the longitudinal direction of the above support film at 200° C. for 30 minutes is preferably 3.00 to 6.50%, more preferably 3.30 to 5.00%, particularly preferably 3.60 to 4.70%. If the heat shrinkage ratio is less than 3.00%, the polyester film tends to be brittle, while if it exceeds 6.50%, dimensional change of the photosensitive element tends to be occurred at the time of lamination.

The heat shrinkage ratio of the present invention can be measured as mentioned below. Test pieces each having a width of 20 mm and a length of 150 mm were cut out along with the longitudinal direction and the lateral direction of the film, 5 pieces per each, and gage points are marked at the center portion of the respective test pieces with a distance of about 100 mm. The test pieces are vertically hanged in a thermostat with internal air circulation maintained at the above temperature ±3° C. for 30 minutes, taken out and allowed to stand at room temperature for 30 minutes, and the distance between the gage points is measured. The heat shrinkage ratio is calculated according to following scheme (2) and an average thereof is obtained whereby the value can be obtained. Incidentally, other regulations are according to JIS C2318-1997 (5.3.4 Dimensional change).

$$\Delta L(\%) = (L_0 - L)/L_0 \times 100 \quad (2)$$

ΔL: a heat shrinkage ratio (%), $L_0$: a distance (mm) between gage points before heating, L: a distance (mm) between gage points after heating.

As a commercially available support film, there may be mentioned, for example, A2100-16, A4100-25 (both trade names) available from Toyo Boseki K.K., Japan, etc.

A thickness of the above support film is preferably 1 to 100 μm, more preferably 1 to 50 μm, particularly preferably 1 to 30 μm, extremely preferably 10 to 30 μm. If the thickness is less than 1 μm, mechanical strength tends to be lowered and a polymer film tends to be torn at the time of coating, while if it exceeds 100 μm, resolution tends to be lowered and a cost tends to be expensive.

The photosensitive element of the first aspect of the present invention can be obtained by using a support film comprising a polyester film in which a resin layer containing fine particles is laminated on one surface of a biaxially oriented polyester film, coating a photosensitive resin composition on the other surface of the support opposed to the surface to which the above resin layer is formed, and drying the same. The above coating can be carried out by the conventionally known method by using a roll coater, a comma coater, a gravure coater, an air knife coater, a die coater, a bar coater, etc. Drying can be carried out at 80 to 150° C. for about 5 to 30 minutes.

Also, the photosensitive element of the second aspect and the photosensitive element of the third aspect of the present invention can be obtained, for example, when a resin layer containing fine particles is present on one surface of the above support film depending on necessity, a layer of the photosensitive resin composition is provided by coating on the surface opposite to the surface to which the above resin layer is provided, and drying. The above coating and drying may be mentioned the same ones as those mentioned in the photosensitive element of the first aspect.

(A) The binder polymer having a carboxyl group of the present invention can be produced, for example, by subjecting a polymerizable monomer having a carboxyl group and other polymerizable monomer to radical polymerization.

The polymerizable monomer having a carboxyl group may include, for example, (meth)acrylic acid, α-bromo(meth) acrylic acid, α-chloro(meth)acrylic acid, β-furyl(meth) acrylic acid, β-styryl(meth)acrylic acid, maleic acid, maleic anhydride, maleic acid monoester such as monomethyl maleate, monoethyl maleate, monoisopropyl maleate, etc., fumaric acid, cinnamic acid, α-cyanocinnamic acid, itaconic acid, crotonic acid, propiolic acid, etc.

The other polymerizable monomer is not specifically limited, and may include, for example, styrene, a styrene derivative in which α-position or aromatic ring is substituted by a substituent(s) such as vinyl toluene, α-methylstyrene, etc., acrylamide such as diacetoneacrylamide, etc., acrylonitrile, an ester of vinyl alcohol such as vinyl-n-butyl ether, etc., alkyl(meth)acrylate, tetrahydrofurfuryl(meth)acrylate, dimethylaminoethyl (meth)acrylate, diethylaminoethyl(meth) acrylate, glycidyl(meth)acrylate, 2,2,2-trifluoroethyl(meth) acrylate, 2,2,3,3-tetrafluoropropyl (meth)acrylate, etc.

As the above alkyl(meth)acrylate, there may be mentioned, for example, a compound represented by the following formula (I):

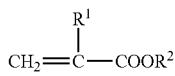

$$CH_2=\underset{R^1}{\overset{}{C}}-COOR^2 \quad (I)$$

wherein $R^1$ represents a hydrogen atom or a methyl group; and $R^2$ represents an alkyl group having 1 to 12 carbon atoms, a compound in which a hydroxyl group, an epoxy group, a halogen group, etc. is substituted at the alkyl group of the above-mentioned compound, or the like.

As the alkyl group having 1 to 12 carbon atoms of $R^2$ in the above formula (I), there may be mentioned, for example, a methyl group, an ethyl group, a propyl group, a butyl group, a pentyl group, a hexyl group, a heptyl group, an octyl group, a nonyl group, a decyl group, an undecyl group, a dodecyl group and a structural isomer of these groups.

As a monomer represented by the above formula (I), there may be mentioned, for example, methyl(meth)acrylate, ethyl (meth)acrylate, propyl(meth)acrylate, butyl(meth)acrylate, pentyl(meth)acrylate, hexyl(meth)acrylate, heptyl(meth) acrylate, octyl(meth)acrylate, 2-ethylhexyl(meth)acrylate, nonyl(meth)acrylate, decyl(meth)acrylate, undecyl(meth) acrylate, dodecyl(meth)acrylate, etc. These monomers may be used singly or in combination of two or more.

Also, in the binder polymer which is Component (A) of the present invention, styrene or styrene derivative may be preferably contained as a polymerizable monomer in view of flexibility of the resulting material.

The styrene or styrene derivative is preferably contained in an amount of 0.1 to 30% by weight as a copolymerizable component to make adhesive property and peeling property good, more preferably 1 to 28% by weight, particularly preferably 1.5 to 27% by weight. If the amount is less than 0.1% by weight, adhesive property tends to be lowered, while if it exceeds 30% by weight, a size of peeled pieces becomes large and a peeling time tends to be long.

These binder polymers may be used singly or in combination of two or more. When the binder polymer is used in combination of two or more, there may be mentioned, for example, two or more binder polymers comprising different copolymer components, two or more binder polymers having different weight average molecular weights, two or more binder polymers having different dispersibilities, etc.

(A) The binder polymer having a carboxyl group according to the present invention preferably has a weight average molecular weight of 20,000 to 300,000 in view of film-forming property and resolution, more preferably 25,000 to 200,000, particularly preferably 30,000 to 150,000. If the weight average molecular weight is less than 20,000, developing solution resistance tends to be lowered, while if it exceeds 300,000, a developing time tends to be long. Incidentally, in the present specification, the weight average molecular weight is measured by using gel permeation chromatography and calculated by using a calibration curve of standard polystyrenes.

An acid value of (A) the binder polymer having a carboxyl group according to the present invention is preferably 50 to 300 mg KOH/g, more preferably 60 to 250 mg KOH/g, particularly preferably 70 to 200 mg KOH/g. If the acid value is less than 50 mg KOH/g, a developing time tends to be long, while if it exceeds 300 mg KOH/g, developing solution resistance of the photocured resist tends to be lowered.

(B) The photopolymerizable compound having at least one polymerizable ethylenically unsaturated group in the molecule according to the present invention may include, for example, a compound obtained by reacting a polyvalent alcohol with an α,β-unsaturated carboxylic acid; a bisphenol A type (meth)acrylate compound such as 2,2-bis(4-((meth) acryloxypolyethoxy)phenyl)propane, 2,2-bis(4-((meth)acryloxypolypropoxy)phenyl)propane, 2,2-bis(4-((meth)acryloxypolyethoxypolypropoxy)phenyl)propane, etc.; a compound obtained by reacting a glycidyl group-containing compound with an α,β-unsaturated carboxylic acid; a urethane monomer such as a (meth)acrylate compound having a urethane bond, etc.; nonylphenyldioxylene(meth)acrylate, γ-chloro-β-hydroxy-propyl-β'-(meth)acryloyloxyethyl-o-phthalate, β-hydroxy-ethyl-β'-(meth)acryloyloxyethyl-o-phthalate, β-hydroxy-propyl-β'-(meth)acryloyloxyethyl-o-phthalate, alkyl(meth)acrylate, etc., and it is preferred that the compound contains the bisphenol A type (meth)acylate compound or the (meth)acrylate compound having a urethane bond as an essential component. These compounds may be used singly or in combination of two or more.

As the above-mentioned compound obtained by reacting the polyvalent alcohol with the α,β-unsaturated carboxylic acid, there may be mentioned, for example, polyethyleneglycol di(meth)acrylate in which a number of the ethylene group is 2 to 14, polypropyleneglycoldi(meth)acrylate in which a number of the propylene group is 2 to 14, trimethylolpropanedi(meth)acrylate, trimethylolpropanetri(meth)acrylate, trimethylolpropaneethoxytri(meth)acrylate, trimethylolpropanediethoxytri(meth)acrylate, trimethylolpropanetriethoxytri(meth)acrylate, trimethylolpropanetetraethoxytri(meth) acrylate, trimethylolpropanepentaethoxytri(meth)acrylate, tetramethylolmethanetri(meth)acrylate, tetramethylolmethanetetra(meth)acrylate, polypropyleneglycoldi(meth) acrylate in which a number of the propylene group is 2 to 14, dipentaerythrytolpenta(meth)acrylate, dipentaerythritolhexa (meth)acrylate, etc.

As the above α,β-unsaturated carboxylic acid, there may be mentioned, for example, (meth)acrylic acid, etc.

As the above 2,2-bis(4-((meth)acryloxypolyethoxy)phenyl)propane, there may be mentioned, for example, 2,2-bis (4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytrideca-ethoxy)phenyl)propane, 2,2-bis(4-((meth)acryloxytetradecaethoxy)phenyl)propane, 2,2-bis(4-((meth)acryloxypentadecaethoxy)phenyl)propane, 2,2-bis (4-((meth)acryloxyhexadecaethoxy)phenyl)propane, etc. Of these, 2,2-bis(4-((meth)-acryloxypentaethoxy)phenyl)propane is commercially available as BPE-500 (trade name, available from Shin-Nakamura Kagaku Kogyo K.K., Japan), and 2,2-bis(4-((meth)acryloxypentadecaethoxy)phenyl)propane is commercially available as BPE-1300 (trade name, available from Shin-Nakamura Kagaku Kogyo K.K., Japan). These compounds may be used singly or in combination of two or more.

As the above 2,2-bis(4-((meth)acryloxypolyethoxypolypropoxy)phenyl)propane, there may be mentioned, for example, 2,2-bis(4-((meth)acryloxydiethoxyoctapropoxy)

phenyl)propane, 2,2-bis(4-((meth)acryloxytetraethoxytetrapropoxy)phenyl)propane, 2,2-bis(4-((meth)acryloxyhexaethoxyhexapropoxy)phenyl)propane, etc. These compounds may be used singly or in combination of two or more.

As the above glycidyl group-containing compound, there may be mentioned, for example, trimethylolpropanetriglycidyl ether tri(meth)acrylate, 2,2-bis(4-(meth)acryloxy-2-hydroxy-propyloxy)phenyl, etc.

As the above urethane monomer, there may be mentioned, for example, an addition reaction product of a (meth)acryl monomer having a OH group at the β-position and a diisocyanate compound such as isophorone diisocyanate, 2,6-tolylene diisocyanate, 2,4-tolylene diisocyanate, 1,6-hexamethylene diisocyanate, etc.; tris((meth)acryloxytetraethylene glycol isocyanate)hexamethylene isocyanurate, EO-modified urethane di(meth)acrylate, EO and PO-modified urethane di(meth)acrylate, etc. Incidentally, EO represents ethylene oxide and the EO-modified compound has a block structure of an ethylene oxide group. Also, PO represents propylene oxide and the PO-modified compound has a block structure of a propylene oxide group.

As the EO-modified urethane di(meth)acrylate, there may be mentioned, for example, UA-11 (trade name, available from Shin-Nakamura Kagaku Kogyo K. K., Japan), etc. Also, the EO and PO-modified urethane di(meth)acrylate, there may be mentioned, for example, UA-13 (trade name, available from Shin-Nakamura Kagaku Kogyo K.K., Japan), etc.

As the above alkyl(meth)acrylate, there may be mentioned, for example, methyl(meth)acrylate, ethyl(meth)acrylate, butyl(meth)acrylate, 2-ethylhexyl(meth)acrylate, etc.

These compounds may be used singly or in combination of two or more.

(C) The photopolymerization initiator in the present invention may include, for example, aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1,2-methyl-1-[4-(methylthio)phenyl]-2-morpholinopropanone-1, etc.; quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-nahthoquinone, 2,3-dimethylanthraquinone, etc.; benzoin ether compounds such as benzoin, methylbenzoin, ethylbenzoin, etc.; benzil derivatives such as benzil dimethyl ketal, etc.; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxy-phenyl)-4,5-diphenylimidazole dimer, 2-(p-methoxyphenyl)-4,5-diphenylimidazole dimer, etc.; acridine derivatives such as 9-phenylacridine, 1,7-bis(9,9'-acridinyl) heptane, etc.; N-phenylglycine, N-phenylglycine derivative, coumarin type compound, etc.

Substituents of the two aryl groups possessed by 2,4,5-triarylimidazole may be the same to provide a symmetric compound or different from each other to provide an asymmetric compound.

Also, a thioxanthone type compound and a tertiary amine compound may be used in combination as in the combination of diethylthioxanthone and dimethylaminobenzoic acid.

Also, 2,4,5-triarylimidazole dimer is more preferably used in view of adhesiveness and sensitivity. These compounds may be used singly or in combination of two or more.

An amount of Component (A) to be formulated in the present invention is preferably 50 to 70 parts by weight, more preferably 55 to 65 parts by weight based on the total 100 parts by weight of Component (A) and Component (B). If the amount is less than 40 parts by weight, film-forming property tends to be lowered when it is used as a photosensitive element, while if it exceeds 80 parts by weight, photocuring tends to be insufficient.

An amount of Component (B) to be formulated in the present invention is preferably 30 to 50 parts by weight, more preferably 35 to 45 parts by weight based on the total 100 parts by weight of Component (A) and Component (B). If the amount is less than 20 parts by weight, photocuring tends to be insufficient, while if it exceeds 60 parts by weight, film-forming property tends to be lowered.

An amount of Component (C) to be formulated in the present invention is preferably 0.01 to 20 parts by weight, more preferably 0.05 to 10 parts by weight, particularly preferably 0.1 to 5 parts by weight based on the total 100 parts by weight of Component (A) and Component (B). If the amount is less than 0.01 part by weight, sensitivity tends to be insufficient, while if it exceeds 20 parts by weight, resolution tends to be worsened.

To the photosensitive resin composition of the present invention may be added, depending on necessity, a dye such as Malachite Green, etc.; a light coloring agent such as leuco Crystal Violet, etc.; a thermal coloration preventive agent; a plasticizer such as p-toluenesulfonic acid amide, etc., a pigment, a filler, a defoaming agent, a flame retardant, a stabilizer, an adhesiveness-imparting agent, a leveling agent, a peeling promoting agent, an antioxidant, a perfume, an imaging agent, a heat cross-linking agent, etc., each in an amount of 0.01 to 20 parts by weight based on the total 100 parts by weight of Component (A) and Component (B). These compounds may be used singly or in combination of two or more.

The photosensitive resin composition of the present invention may be coated as a solution with a solid content of about 30 to 60% by weight by dissolving it in a solvent such as methyl alcohol, ethyl alcohol, acetone, methyl ethyl ketone, ethylene glycol monomethyl ether, ethylene glycol monoethyl ether, toluene, N-dimethylformamide, etc., or a mixed solvent of the above solvents, if necessary.

Also, a thickness of the photosensitive resin composition layer may vary depending on the use, and preferably 1 to 200 μm, more preferably 1 to 100 μm, particularly preferably 1 to 30 μm with a thickness after drying. If the thickness is less than 1 μm, formation of a film tends to be industrially difficult, while if it exceeds 200 μm, photocuring property at the bottom portion of a resist tends to be worsened.

The photosensitive element of the present invention comprising two layers of the thus obtained photosensitive resin composition layer and a support film is stored by, for example, winding it around a core as such or further laminating a protective film on the other surface (the surface opposed to the surface existing the support film) of the photosensitive resin composition layer. Incidentally, at this time, it is preferred to wind the photosensitive element so that the support film is the outermost layer. A winding rate and a winding tension at the time of winding can be optionally determined. As the above protective film, there may be mentioned, for example, an inert polyolefin film such as polyethylene, polypropylene, etc., and the polyethylene film is preferred in view of peeling property from the photosensitive resin composition layer. Also, it is preferred to use a protective film with a low fish eye to avoid occurrence of air voids. An edge surface separator is preferably provided at the edge surface of the above roll-shaped photosensitive element roll to protect the edge surface, and a moistureproof edge surface separator is preferably provided to prevent edge fusion. The photosensitive element roll is preferably packed by wrapping with a black sheet having a low permeability. In the present specification, the term "edge fusion" means a phenomenon in which the photosensitive resin composition layer is oozed out from the edge surface of the photosensitive element roll.

As the above core, a cylindrical shape core is preferred and the core may comprise, for example, plastics such as polyethylene resin, polypropylene resin, polystyrene resin, polyvinyl chloride resin, ABS resin (acrylonitrile-butadiene-styrene copolymer), etc., paper, and the like.

The photosensitive element roll of the present invention is a material, as shown in FIG. 1, in which a photosensitive element 2 is winding around a core 1. When the photosensitive element roll 3 is naturally dropped five times from the height of 10 cm to a collision surface 4 so that the axis direction of the core 1 becomes perpendicular to the collision surface 4, a total height of winding deviation at the edge surface of the photosensitive element roll 3 after the above operation is 1 mm or less.

The above dropping is preferably carried out continuously five times, more preferably continuously carried out five times in 1 minute. Also, the above dropping test is preferably carried out after storing the above photosensitive element roll in an insulating container at about 0 to 10° C. for 8 to 12 hours.

A size of the above core may be mentioned, for example, a diameter of 5 to 10 cm and a length to the axis direction of 10 to 80 cm, and the like.

A width of the photosensitive element roll when the photosensitive element roll is winding around the core is not specifically limited, and preferably narrower than the length of the axis direction of the core, more preferably about 1 to 10 cm shorter than that of the core. A length of the photosensitive element roll to be wound around the core is not particularly limited, and preferably about 10 to 550 m.

The above collision surface 4 is preferably a material which is not broken even when the photosensitive element roll is dropped thereon, and may comprise, for example, a concrete surface, a metal surface, etc.

Figure 2A:
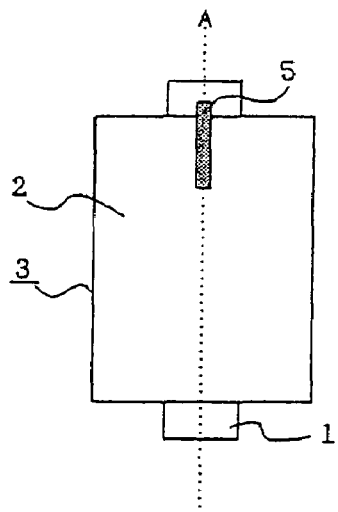
FIGS. 2A and 2B are schematic drawings showing a method for measuring a height of winding deviation of a photosensitive element roll.
Figure 2B:
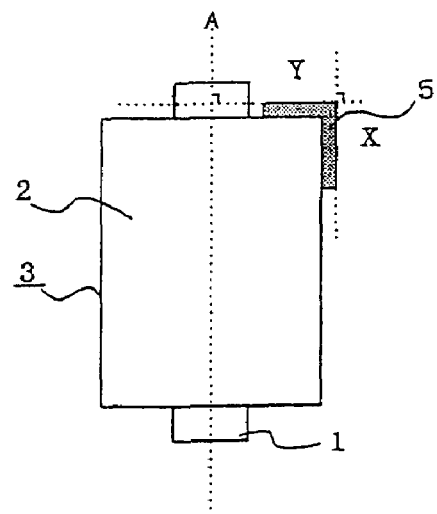
Figure 3:
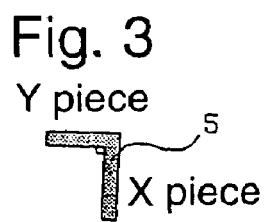
FIG. 3 is a schematic drawing showing an L-square.
Figure 4A:
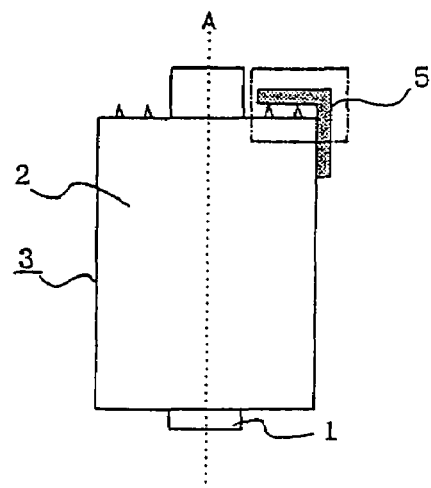
FIG. 4A is a schematic drawing showing winding deviation-occurred portion of a photosensitive element roll and FIG. 4B is an enlarged partial view thereof.
Figure 4B:
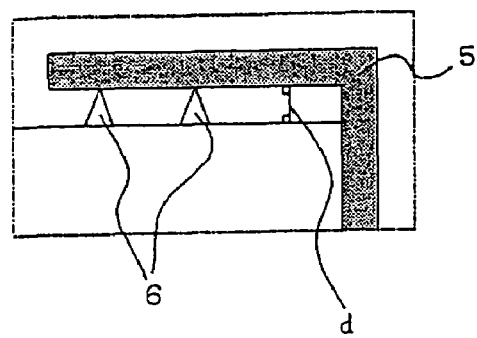

The total height of winding deviation at the edge surface of the photosensitive element roll after it was naturally dropped five times can be measured as mentioned below. First, as shown in FIG. 2, FIG. 3 and FIG. 4, an L-square 5 is put at the edge portion of the photosensitive element roll 3 so that an X piece of the L-square 5 becomes parallel to the plane passing through the axis direction of the core 1 and a Y piece of the same becomes perpendicular to the place passing through the axis direction of the core 1. Next, a distance (a height d of winding deviation) of the winding deviation 6 occurred from the edge portion of the photosensitive element roll 3 to the top point is measured. In the present specification, as the height of the winding deviation, the maximum value of the winding deviation is employed and the value is made as a height of the winding deviation of the photosensitive element roll. Also, in the present specification, winding deviation means a difference of deviation at the edge surface of the photo-sensitive element roll before dropping and after dropping.

When a resist pattern is prepared by using the above photosensitive element, if a protective film is present, it can be prepared, for example, by removing the protective film, and bringing the photosensitive resin composition layer into contact with a substrate for forming a circuit by pressure under heating whereby the layer is laminated to the substrate. The lamination is preferably carried out under reduced pressure to obtain good adhesion and conformity. The surface to be laminated is generally a metal surface, but it is not particularly limited to these materials. A temperature of the photosensitive resin composition layer to be heated is preferably 70 to 130° C., and a contact-bonding pressure is preferably 0.1 to 1 MPa (1 to 10 kgf/cm$^2$), but it is not particularly limited to these ranges. Also, when the photosensitive resin composition layer is heated at 70 to 130° C., it is not necessary to pre-heat the substrate for forming a circuit. Moreover, in order to further improve lamination characteristics, a pre-heating treatment of the substrate for forming a circuit may be carried out.

Then, the photosensitive resin composition layer which has been thus laminated is imagewisely irradiated by an active light through a negative or positive mask pattern which is so-called art work. At this time, when a polymer film existing on the photosensitive resin composition layer is transparent, active light may be irradiated as such, and when the polymer film is opaque, it is necessary to remove the film as a matter of course.

As a light source of the active light, there may be used a conventionally known light source which effectively irradiates ultraviolet rays such as carbon arc lamp, mercury vapor arc lamp, ultra-high pressure mercury lamp, high pressure mercury lamp, xenon lamp, etc. Also, a light source which irradiates visible rays, such as a photoflood lamp for photography, a sunlight lamp, etc. may be used.

Next, after exposure, when a support is present on the photosensitive resin composition layer, the support is removed, unexposed portion is removed and developed by wet development, dry development, etc., to prepare a resist pattern.

In the case of the wet development, development is carried out by the conventionally known method such as spray, dipping by rocking, brushing, scraping, etc. by using a developing solution corresponding to a photosensitive resin composition such as an aqueous alkaline solution, an aqueous developing solution, an organic solvent and the like.

As the developing solution, those which are safe, stable and easily operable such as an aqueous alkaline solution may be used.

As a base of the above aqueous alkaline solution, there may be used an alkali hydroxide such as a hydroxide of lithium, sodium or potassium, etc.; an alkali carbonate such as a carbonate or a bicarbonate of lithium, sodium, potassium or ammonium, etc.; an alkali metal phosphate such as potassium phosphate, sodium phosphate, etc.; and an alkali metal pyrophosphate such as sodium pyrophosphate, potassium pyrophosphate, etc.

As the aqueous alkaline solution to be used for development, preferred are a 0.1 to 5% by weight diluted sodium carbonate solution, a 0.1 to 5% by weight diluted potassium carbonate solution, a 0.1 to 5% by weight diluted sodium hydroxide solution, a 0.1 to 5% by weight diluted sodium tetraborate solution, and the like.

A pH of the aqueous alkaline solution to be used for development is preferably within the range of 9 to 11, and a temperature thereof can be controlled depending on the developability of the photosensitive resin composition layer.

To the aqueous alkaline solution may be added a surfactant, a defoaming agent, a small amount of an organic solvent to accelerate the development, etc.

The above aqueous developing solution comprises water or an aqueous alkaline solution, and at least one of an organic solvent. Here, as the alkali substance, in addition to the above substances, there may be mentioned, for example, borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2, morpholine, etc.

A pH of the developing solution is preferably as low as possible within the range during which development of the resist can be sufficiently carried out, it is preferably a pH of 8 to 12, more preferably a pH of 9 to 10.

As the above organic solvent, there may be mentioned, for example, triacetonealcohol, acetone, ethyl acetate, alkoxyethanol having an alkoxy group with 1 to 4 carbon atoms, ethyl alcohol, isopropyl alcohol, butyl alcohol, diethylene glycol monomethyl ether, diethylene glycol monoethyl ether, diethylene glycol monobutyl ether, etc. These solvents may be used singly or in combination of two or more.

A concentration of the organic solvent is generally preferably 2 to 90% by weight and a temperature thereof may be adjusted depending on the developability.

To the aqueous developing solution may be added a small amount of a surfactant, a defoaming agent, etc.

As an organic solvent type developing agent which can be used singly, there may be mentioned, for example, 1,1,1-trichloroethane, N-methylpyrrolidone, N,N-dimethylformamide, cyclohexanone, methyl isobutyl ketone, γ-butyrolactone, etc. Water is preferably added to the organic solvent in the range of 1 to 20% by weight to prevent inflammation. Also, if necessary, two or more developing systems may be used in combination.

In the developing system, there are a dipping system, a bottle system, a spray system, brushing, scraping, etc., and a high pressure spray system is most suitable for improving resolution.

As a post-developing treatment, the resist pattern may be further cured by heating at about 60 to 250° C. or subjecting to exposure with 0.2 to 10 mJ/cm$^2$, if necessary, and used.

The resist pattern of the present invention has further four characteristic features.

The first characteristic feature of the resist pattern according to the present invention resides in that unevenness on the side surface of the resist pattern is 0 to 3.0 μm.

The second characteristic feature of the resist pattern according to the present invention resides in that a number of unevenness larger than 3.0 μm on the center line of the side surface of the resist pattern is 0 to 5/4 mm.

The third characteristic feature of the resist pattern according to the present invention resides in that a mathematical average roughness ($R_a$) on the side surface of the resist pattern is 0 to 2.0 μm.

The fourth characteristic feature of the resist pattern according to the present invention resides in that a maximum height ($R_y$) on the side surface of the resist pattern is 0 to 3.0 μm.

Figure 5:
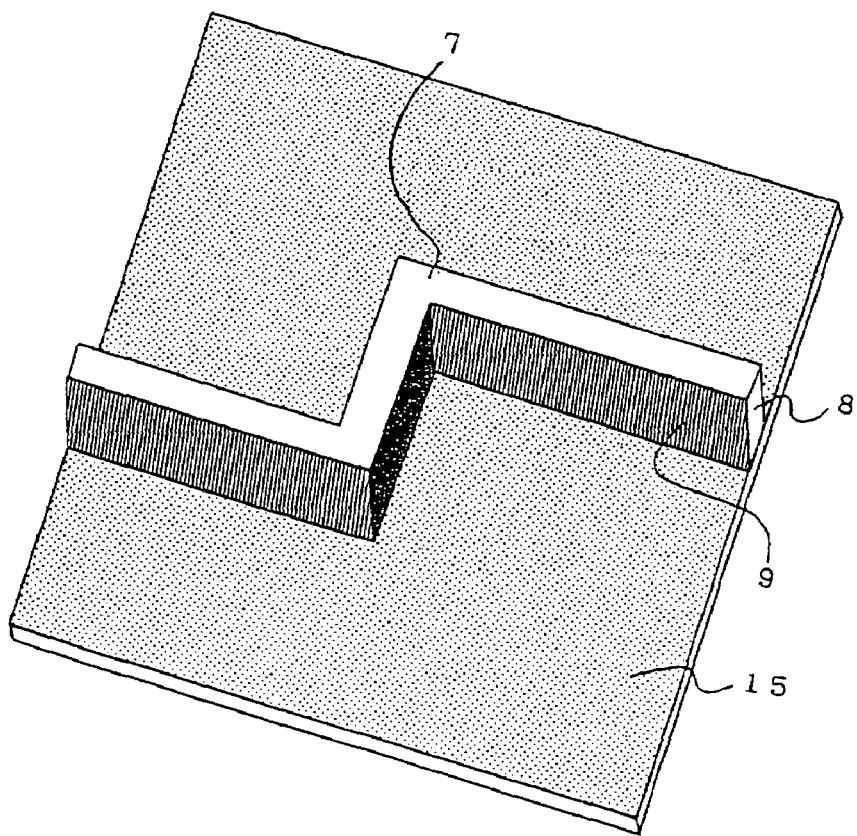
FIG. 5 is a schematic drawing showing a resist pattern.

Here, the side surface of the resist pattern according to the present invention means, as shown in FIG. 5, a surface of a resist pattern in the direction perpendicular to the substrate 15 (a thickness direction of a photosensitive resin composition layer in a photosensitive element) in the resist pattern 7 obtained by imagewisely exposing a layer of the photosensitive resin composition layer laminated on the substrate from upper portion of the substrate to active light and then subjecting to development.

Also, unevenness on the side surface of the resist pattern according to the present invention means, as shown in FIG. 5, linear grooves 9 existing on the side surface 8 of the resist pattern perpendicular to the substrate 15 (a thickness direction of a photosensitive resin composition layer in a photosensitive element).

The unevenness on the side surface of the resist pattern in the first characteristic feature of the resist pattern according to the present invention is required to be 0 to 3.0 μm, preferably 0 to 2.8 μm, more preferably 0 to 2.5 μm, further preferably 0 to 2.3 μm, particularly preferably 0 to 2.0 μm, extremely preferably 0 to 1.8 μm, and most extremely preferably 0 to 1.5 μm. If the value exceeds 3.0 μm, side wall flatness, electric resistance and line appearance of the resulting wiring pattern tend to be poor.

The number of unevenness larger than 3.0 μm on the center line of the side surface of the resist pattern in the second characteristic feature of the resist pattern according to the present invention is required to be 0 to 5/4 mm, preferably 0 to 4/4 mm, more preferably 0 to 3/4 mm, further preferably 0 to 2/4 mm, particularly preferably 0 to 1/4 mm, and extremely preferably 0/4 mm. If the value exceeds 5/4 mm, side wall flatness, electric resistance and line appearance of the resulting wiring pattern tend to be poor.

The mathematical average roughness ($R_a$) on the side surface of the resist pattern in the third characteristic feature of the resist pattern according to the present invention is required to be 0 to 2.0 μm, preferably 0 to 1.8 μm, more preferably 0 to 1.5 μm, further preferably 0 to 1.3 μm, particularly preferably 0 to 1.0 μm, extremely preferably 0 to 0.8 μm, and most extremely preferably 0 to 0.5 μm. If the value exceeds 2.0 μm, side wall flatness, electric resistance and line appearance of the resulting wiring pattern tend to be poor.

The maximum height ($R_y$) on the side surface of the resist pattern in the fourth characteristic feature of the resist pattern according to the present invention is required to be 0 to 3.0 μm, preferably 0 to 2.8 μm, more preferably 0 to 2.5 μm, further preferably 0 to 2.3 μm, particularly preferably 0 to 2.0 μm, extremely preferably 0 to 1.8 μm, and most extremely preferably 0 to 1.5 μm. If the value exceeds 3.0 μm, side wall flatness, electric resistance and line appearance of the resulting wiring pattern tend to be poor.

The width of the resist pattern according to the present invention is not specifically limited, and preferably 1 μm or more, more preferably 3 μm or more, further preferably 5 μm or more, particularly preferably 5 to 1000 μm, more particularly preferably 6 to 1000 μm, extremely preferably 7 to 1000 μm, more extremely preferably 8 to 1000 μm, further extremely preferably 9 to 900 μm, and most extremely preferably 10 to 800 μm.

The height of the resist pattern according to the present invention is not specifically limited, and preferably 1 to 150 μm, more preferably 1 to 110 μm, further preferably 2 to 100 μm, particularly preferably 3 to 90 μm, extremely preferably 4 to 80 μm, and most extremely preferably 5 to 75 μm.

The unevenness on the side surface of the resist pattern according to the present invention can be measured, for example, as mentioned below. First, a photosensitive resin composition layer is laminated on a substrate, and then, the material is exposed (30 to 200 MJ/cm$^2$ or so: it is optionally selected so that a rectangular-shaped resist pattern can be obtained) and developed (0.1 to 5% by weight dilute sodium carbonate solution, etc., 20 to 40° C. or so: it is optionally selected so that a rectangular-shaped resist pattern can be obtained) by using a linear negative pattern (having windows through which active light with the size of 100 μm×1 cm is passed) to form a linear and rectangular-shaped resist pattern (width: 100 μm, length: 1 cm, height: a thickness of the photosensitive resin composition layer).

Figure 6:
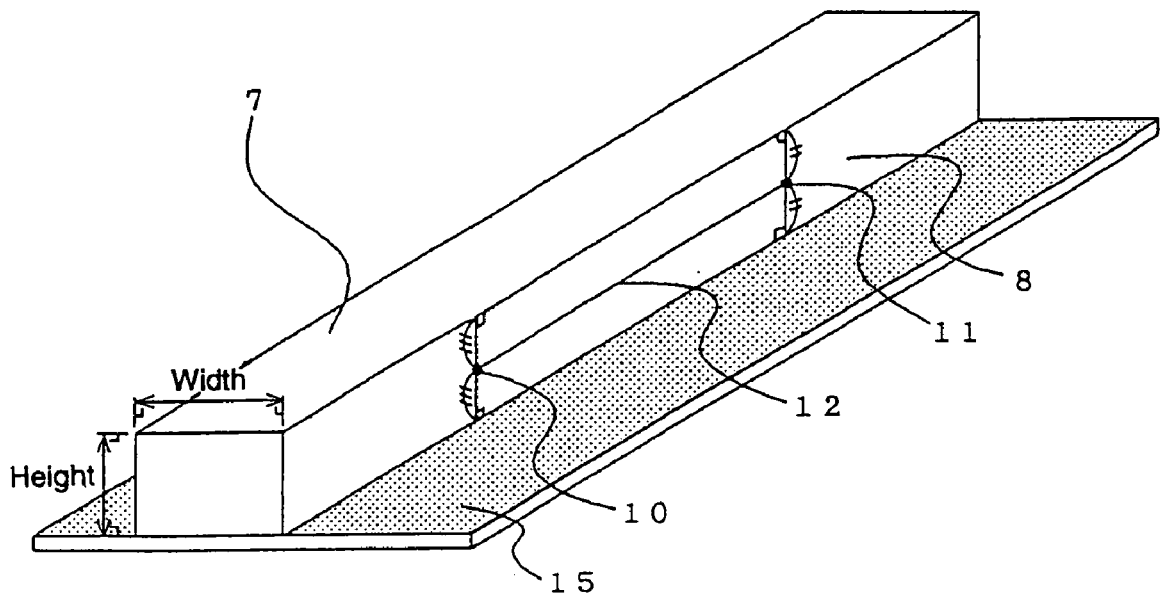
FIG. 6 is a schematic drawing showing a measurement method of a concavo-convex portion on the side surface of a resist pattern.

Here, as shown in FIG. 6, a surface of the resist pattern perpendicular to the substrate and parallel to the lengthwise direction of the resist pattern 7 is made a side surface 8 of the resist pattern, and a lateral width of the side surface 8 of the resist pattern is made a height of the resist pattern. Also, the lateral width of the surface of the resist pattern parallel to the substrate and perpendicular to the side surface of the resist pattern is made a width of the resist pattern. Then, on the side surface 8 of the resist pattern, two lines perpendicular to the substrate are optionally drawn and their respective center points are each called as a center point S 10 and a center point T 11. These center points S 10 and T 11 are linked with a line and the line is called to as a center line 12 (the center points S 10 and T 11 are placed so that the length of the center line 12 becomes 4 mm) of the side surface 8 of the resist pattern. Here, unevenness on the side surface of the resist pattern is measured within the range of the center line 12 (length: 4 mm) of the side surface 8 of the resist pattern.

Figure 7:
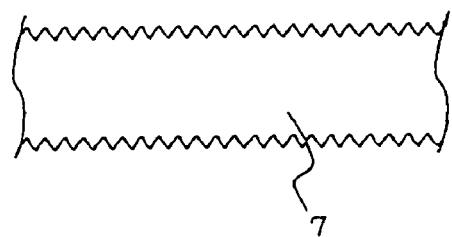
FIG. 7 is a sectional view of a resist pattern.
Figure 8:
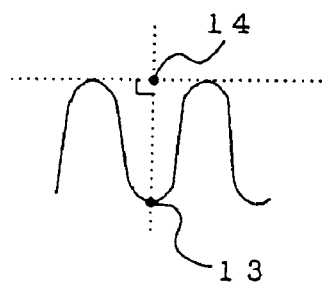
FIG. 8 is a sectional view of concave-convex portion on the side surface of a resist pattern.

The above-mentioned unevenness on the center line of the side surface of the resist pattern means, as shown in FIGS. 7 and 8, a line perpendicular to a tangent line of the two convex portions adjacent to each other and parallel to the substrate, and shows a distance between a deepest point 13 of the concave portion located between the two convex portions adjacent to each other and a point of intersection 14 which is a point of intersection of a line passing through the deepest point 13 of the concave portions located between the two convex portions adjacent to each other and the above tangent line. Incidentally, FIG. 7 is a sectional view in which it is cut with a surface passing through the center line on the side surface of the resist pattern and parallel to the substrate, and FIG. 8 is an enlarged sectional view of the uneven portion of FIG. 7.

The unevenness on the center line on the side surface of the above-mentioned resist pattern can be measured by, for example, an optical microscope, a scanning type electron microscope (SEM), a contact type surface roughness measurement apparatus, a non-contact type three dimensional surface roughness measurement apparatus, a Profile Measurement Microscope (VF-7500, tradename, manufactured by Keyence, Japan, etc.), a Color Lazer 3D Profile Microscope (VK-8500, tradename, manufactured by Keyence, Japan, etc.) and the like.

The unevenness on the side surface of the resist pattern can be easily measured from the perpendicular direction by using an apparatus capable of measuring the unevenness to the depth direction without contacting the material to be measured such as the above-mentioned Profile Measurement Microscope (VF-7500, trade name, manufactured by Keyence, Japan, etc.), the Color Lazer 3D Profile Microscope (VK-8500, trade name, manufactured by Keyence, Japan, etc.) and the like.

When the unevenness on the side surface of the resist pattern is measured by using the above-mentioned optical microscope, the scanning type electron microscope (SEM), etc., the unevenness can be easily measured by observing, from the upper side of the substrate, the sectional surface of the resist pattern along with the center line obtained by cutting the side surface 8 of the resist pattern in a direction passing through the center line 12 which is parallel to the substrate and perpendicular to the side surface of the resist pattern. Also, the unevenness can be observed from diagonally upper the resist pattern without cutting the same.

The mathematical average roughness ($R_a$) and the maximum height ($R_y$) on the side surface of the resist pattern according to the present invention can be also measured, for example, by the same manner as that of the method for measuring the unevenness on the side surface of the resist pattern as mentioned above. Incidentally, the mathematical average roughness ($R_a$) and the maximum height ($R_y$) in the present invention are measured according to JIS B 0601 and values at which a cut-off value $\lambda_c$=0.8 mm and an evaluation length $l_n$=4 mm.

The mathematical average roughness ($R_a$) and the maximum height ($R_y$) of the side surface of the resist pattern as mentioned above can be measured, for example, by a contact type surface roughness measuring apparatus, a Profile Measurement Microscope (VF-7500, tradename, manufactured by Keyence, Japan, etc.), a Color Laser 3D Profile Microscope (VK-8500, trade name, manufactured by Keyence, Japan, etc.) and the like. It is preferred to use a Profile Measurement Microscope, a Color Laser 3D Profile Microscope, etc., which are capable of effecting non-contact measurement.

For effecting etching of a metal surface to be carried out after development, there may be used a cupric chloride solution, a ferric chloride solution, an alkali etching solution, a hydrogen peroxide type etching solution, etc. It is desired to use a ferric chloride solution in the point of having a good etch factor.

When a printed wiring board is to be produced by using the photosensitive element according to the present invention, the surface of a substrate for forming a circuit is treated by the conventionally known method such as etching, plating, etc., by using the developed resist pattern as a mask.

As the above plating method, there may be mentioned, for example, copper plating such as copper sulfate plating, copper pyrophosphate plating, etc.; solder plating such as high slow solder plating, etc.; nickel plating such as Watt bath (nickel sulfate-nickel chloride) plating, nickel sulfamate plating, etc.; gold plating such as hard gold plating, soft gold plating, etc.

As mentioned above, a wiring pattern can be obtained by subjecting the substrate for forming a circuit on which a resist pattern has been formed to etching or plating.

On the other hand, the wiring pattern of the present invention has further four characteristics as mentioned below.

The first characteristic feature of the wiring pattern according to the present invention resides in that unevenness on the side surface of the resist pattern is 0 to 3.0 µm.

The second characteristic feature of the wiring pattern according to the present invention resides in that a number of unevenness larger than 3.0 µm on the center line of the side surface of the resist pattern is 0 to 5/4 mm.

The third characteristic feature of the wiring pattern according to the present invention resides in that a mathematical average roughness ($R_a$) on the side surface of the resist pattern is 0 to 2.0 µm.

The fourth characteristic feature of the wiring pattern according to the present invention resides in that a maximum height ($R_y$) on the side surface of the resist pattern is 0 to 3.0 µm.

The wiring pattern of the present invention tends to be etched or plated along with the unevenness on the side surface of the resist pattern so that it is preferred that the unevenness on the side surface of the wiring pattern is small in view of line appearance and electric resistance.

The unevenness on the side surface of the wiring pattern in the first characteristic feature of the wiring pattern according to the present invention is required to be 0 to 3.0 µm, preferably 0 to 2.8 µm, more preferably 0 to 2.5 µm, further preferably 0 to 2.3 µm, particularly preferably 0 to 2.0 µm, extremely preferably 0 to 1.8 µm, and most extremely preferably 0 to 1.5 µm. If the value exceeds 3.0 µm, side wall flatness, electric resistance and line appearance of the resulting wiring pattern tend to be poor.

The number of unevenness larger than 3.0 μm on the center line of the side surface of the wiring pattern in the second characteristic feature of the wiring pattern according to the present invention is required to be 0 to 5/4 mm, preferably 0 to 4/4 mm, more preferably 0 to 3/4 mm, further preferably 0 to 2/4 mm, particularly preferably 0 to 1/4 mm, and extremely preferably 0/4 mm. If the value exceeds 5/4 mm, side wall flatness, electric resistance and line appearance of the resulting wiring pattern tend to be poor.

The mathematical average roughness ($R_a$) on the side surface of the wiring pattern in the third characteristic feature of the wiring pattern according to the present invention is required to be 0 to 2.0 μm, preferably 0 to 1.8 μm, more preferably 0 to 1.5 μm, further preferably 0 to 1.3 μm, particularly preferably 0 to 1.0 μm, extremely preferably 0 to 0.8 μm, and most extremely preferably 0 to 0.5 μm. If the value exceeds 2.0 μm, sidewall flatness, electric resistance and line appearance of the resulting wiring pattern tend to be poor.

The maximum height ($R_y$) on the side surface of the wiring pattern in the fourth characteristic feature of the wiring pattern according to the present invention is required to be 0 to 3.0 μm, preferably 0 to 2.8 μm, more preferably 0 to 2.5 μm, further preferably 0 to 2.3 μm, particularly preferably 0 to 2.0 μm, extremely preferably 0 to 1.8 μm, and most-extremely preferably 0 to 1.5 μm. If the value exceeds 3.0 μm, side wall flatness, electric resistance and line appearance of the resulting wiring pattern tend to be poor.

The width of the wiring pattern according to the present invention is not specifically limited, and preferably 1 μm or more, more preferably 3 μm or more, further preferably 5 μm or more, particularly preferably 5 to 1000 μm, more particularly preferably 6 to 1000 μm, extremely preferably 7 to 1000 μm, more extremely preferably 8 to 1000 μm further extremely preferably 9 to 900 μm, and most extremely preferably 10 to 800 μm.

The height of the wiring pattern according to the present invention is not specifically limited, and preferably 0.01 to 200 μm, more preferably 0.02 to 190 μm, further preferably 0.03 to 180 μm, particularly preferably 0.05 to 150 μm, further particularly preferably 0.08 to 130 μm, extremely preferably 0.10 to 100 μm, further extremely preferably 1.00 to 100 μm, and most extremely preferably 5.00 to 50 μm.

The unevenness on the side surface of the wiring pattern according to the present invention can be measured, for example, as mentioned below. First, a resist pattern is formed on a substrate for forming a circuit, and then, the resulting material is subjected to etching (an aqueous ferric chloride solution, an aqueous cupric chloride solution, etc., 40 to 60° C. or so) to prepare a linear wiring pattern (width: 100 μm, length: 1 cm, height: a thickness of the metal layer of the substrate for forming a circuit). Here, in the same manner as in the side surface of the resist pattern, a surface of the wiring pattern perpendicular to the substrate and parallel to the lengthwise direction of the wiring pattern is made a side surface of the wiring pattern, and a lateral width of the side surface of the wiring pattern is made a height of the wiring pattern. Also, the lateral width of the surface of the wiring pattern parallel to the substrate and perpendicular to the side surface of the wiring pattern is made a width of the wiring pattern. Then, on the side surface of the wiring pattern, two lines perpendicular to the substrate are optionally drawn and their respective center points are each called as a center point M and a center point N. These center points M and N are linked with a line and the line is called to as a center line (the center points M and N are placed so that the length of the center line becomes 4 mm) of the side surface of the wiring pattern. Here, unevenness on the side surface of the wiring pattern is measured within the range of the center line (length: 4 mm) of the side surface of the wiring pattern.

The above-mentioned unevenness on the center line on the side surface of the wiring pattern means a line perpendicular to a tangent line of the two convex portions adjacent to each other and parallel to the substrate as in the unevenness on the center line on the side surface of the resist pattern, and shows a distance between a deepest point of the concave portion located between the two convex portions adjacent to each other and a point of intersection which is a point of intersection of a line passing through the deepest point of the concave portions located between the two convex portions adjacent to each other and the above tangent line.

The unevenness on the center line on the side surface of the above-mentioned wiring pattern can be measured by, for example, an optical microscope, a scanning type electron microscope (SEM), a contact type surface roughness measurement apparatus, a non-contact type three dimensional surface roughness measurement apparatus, a Profile Measurement Microscope (VF-7500, trade name, manufactured by Keyence, Japan, etc.), a Color Lazer 3D Profile Microscope (VK-8500, trade name, manufactured by Keyence, Japan, etc.) and the like.

The unevenness on the side surface of the wiring pattern can be easily measured from the perpendicular direction by using an apparatus capable of measuring the unevenness to the depth direction without contacting the material to be measured such as the above-mentioned Profile Measurement Microscope (VF-7500, trade name, manufactured by Keyence, Japan, etc.), the Color Lazer 3D Profile Microscope (VK-8500, trade name, manufactured by Keyence, Japan, etc.) and the like.

When the unevenness on the side surface of the wiring pattern is measured by using the above-mentioned optical microscope, the scanning type electron microscope (SEM), etc., the unevenness can be easily measured by observing, from the upper side of the substrate, the sectional surface of the wiring pattern along with the center line obtained by cutting the side surface of the wiring pattern in a direction passing through the center line which is parallel to the substrate and perpendicular to the side surface of the wiring pattern. Also, the unevenness can be observed from diagonally upper the wiring pattern without cutting the same.

The mathematical average roughness ($R_a$) and the maximum height ($R_y$) on the side surface of the wiring pattern according to the present invention can be also measured, for example, by the same manner as that of the method for measuring the unevenness on the side surface of the wiring pattern as mentioned above. Incidentally, the mathematical average roughness ($R_a$) and the maximum height ($R_y$) in the present invention are measured according to JIS B 0601 and values at which a cut-off value $\lambda_c$=0.8 mm and an evaluation length $l_n$=4 mm.

The mathematical average roughness ($R_a$) and the maximum height ($R_y$) of the side surface of the wiring pattern as mentioned above can be measured, for example, by a contact type surface roughness measuring apparatus, a Profile Measurement Microscope (VF-7500, tradename, manufactured by Keyence, Japan, etc.), a Color Laser 3D Profile Microscope (VK-8500, trade name, manufactured by Keyence, Japan, etc.) and the like. It is preferred to use a Profile Measurement Microscope, a Color Laser 3D Profile Microscope, etc., which are capable of effecting non-contact measurement.

Then, the resist pattern can be peeled off, for example, by an aqueous alkali solution stronger than the aqueous alkali solution used in the development.

As such an aqueous strong alkali solution, there may be used an aqueous 1 to 10% by weight sodium hydroxide solution, an aqueous 1 to 10% by weight potassium hydroxide solution and the like.

As the peeling method, there maybe mentioned, for example, a dipping system, a spraying system, etc., and the dipping system and the spraying system may be used singly or in combination. Also, the printed wiring board to which a resist pattern has been formed may be a multi-layer printed wiring board.

EXAMPLES

Next, the present invention will be explained in more detail by referring to Examples.

Examples 1 and 2, and Comparative Examples 1 to 3

Component (A) was synthesized by using the components shown in Table 1 to prepare a solution, and Component (B), Component (C), other components and solvents were mixed with the solution to prepare a solution of a photosensitive resin composition.

TABLE 1

| Material | | Formulation amount |
|---|---|---|
| Component (A) | 40% by weight solution of methacrylic acid/methyl methacrylate/styrene copolymer (weight ratio: 25/50/25, weight average molecular weight: 70,000, acid value: 163 mg KOH/g) in toluene/methyl cellosolve (weight ratio: 4/6) | 150 g (solid component: 60 g) |
| Component (B) | 2,2-Bis(4-(methacryloxy-pentaethoxy)phenyl)propane | 30.0 g |
| | γ-Chloro-β-hydroxypropyl-β'-methacryloxyethyl-o-phthalate | 10.0 g |
| Component (C) | 2-(o-Chlorophenyl)-4,5-diphenylimidazole dimer | 3.0 g |
| | N,N'-Tetraethyl-4,4'-diaminobenzophenone | 0.15 g |
| Other Components | Leuco Crystal Violet | 0.5 g |
| | Marachite Green | 0.05 g |
| | p-Toluenesulfonic amide | 4.0 g |
| Solvents | Acetone | 10.0 g |
| | Toluene | 10.0 g |
| | Methanol | 3.0 g |
| | N,N-Dimethylformamide | 3.0 g |

The resulting solution of the photosensitive resin composition was uniformly coated on a support film (A2100-16 and A4100-25 (biaxially oriented polyethylene terephthalate each having a resin layer containing fine particles on one surface thereof), available from Toyo Boseki K.K., Japan; G2-16, G2-19 and V-20 (polyethylene terephtalate each having no resin layer containing fine particles), available from Teijin Limited, Japan) shown in Table 2 and dried in an oven with internal air circulation at 100° C. for 10 minutes to obtain respective photosensitive elements. Each film thickness of the photosensitive resin composition layer after drying was 20 μm.

Hazes of the support films shown in Table 2 were measured according to JIS K 7105 by using a haze meter (TC-H3DP, trade name, manufactured by Tokyo Denshoku K.K., Japan).

Also, 5 sheets of test pieces with a width of 20 mm and a length of 150 mm were cut out along with the longitudinal direction and the lateral direction, respectively, and then, gage points were marked at the center portion of the respective test pieces with a distance of 100 mm. The test pieces were vertically hanged in a thermostat with internal air circulation maintained at 105±3° C., 150±3° C. and 200±3° C. for 30 minutes, taken out and allowed to stand at room temperature for 30 minutes, and the distance between the gage points was measured. The heat shrinkage ratio was calculated from the above-mentioned scheme (2) and an average of the respective samples was calculated.

Next, a copper surface of a copper-clad laminated board (MCL-E-61, trade name, available from Hitachi Chemical Co., Ltd., Japan) which comprises a glass-epoxy material on which copper foils (each a thickness of 35 μm) had been laminated on the both surfaces thereof was polished by using a polishing machine (manufactured by Sankei K.K., Japan) having a brush corresponding to #600, washed with water and dried with air stream. The resulting copper-clad laminated board was heated to 80° C., and the above-mentioned photosensitive resin composition layer was laminated on the copper surface at 120° C. and 0.4 MPa (4 kgf/cm$^2$).

Thereafter, exposure was carried out by using an exposure machine (model: HMW-201B, trade name, manufactured by Orc Seisakusho Co., Japan) having a 3 KW ultra high pressure mercury lamp in such an energy dose that the number of remaining step grades after development became 8.0, using a photo tool having a Stofer 21 grade step tablet as a negative mask and a photo tool having a wiring pattern with a line/space of 30/400 to 250/400 (resolution, unit: μm) as a negative mask for evaluating adhesive property. Then, the support film was removed, and development was carried out by spraying a 1.0% by weight aqueous sodium carbonate solution at 30° C. Here, the adhesive property was evaluated with the minimum value of the line width among the fine lines adhered to the substrate after the development. The smaller numerical value obtained by the adhesive property test means better results.

Thereafter, by using a comb-shaped pattern with 5 μm, a resist pattern was prepared by the same manner as that of the adhesion property test, and resolution (μm) was evaluated from the remaining resist pattern. The smaller numerical value obtained by the resolution test means better results.

Next, exposure was carried out with the above-mentioned energy dose and a line width/space width of 50 μm/50 μm followed by development, and the shape of the resulting resist pattern was observed by a scanning type electron microscope to evaluate the nick property on the side surface of the resist pattern. The nick property on the side surface of the resist pattern means the state in which the shape of the resist pattern is not plain and an unfavorable side surface is present on the side of the resist pattern. The unevenness due to the nick on the side surface of the resist pattern is preferably shallow.

Deep: The case where unevenness of the side surface's nick exceeds 2 μm

Shallow: The case where unevenness of the side surface's nick is not more than 2 μm.

The results are shown in Table 2.

Also, the contact angles of the X surface (a surface to which the photosensitive resin composition is coated and dried) and the Y surface (a surface opposite to the surface to which the photosensitive resin composition is coated and dried) of the support films shown in Table 2 were measured according to JIS R 3257 and using a contact angle meter CA-A (trade name, available from Kyowa Kaimen Kagaku K.K., Japan, QI optical mirror system).

TABLE 2

|  |  |  | Example 1 | Example 2 | Comparative example 1 | Comparative example 2 | Comparative example 3 |
|---|---|---|---|---|---|---|---|
| Support film |  |  | A2100-16 | A4100-25 | G2-16 | G2-19 | V-20 |
| Thickness of support film (μm) |  |  | 16 | 25 | 16 | 19 | 20 |
| Haze (%) |  |  | 0.2 | 0.8 | 2.2 | 2.5 | 5.5 |
| Thermal shrinkage ratio (%) | Longitudinal direction | 105° C. | 0.46 | 0.49 | 0.50 | 0.53 | 0.58 |
|  |  | 150° C. | 1.35 | 1.51 | 2.00 | 2.33 | 2.39 |
|  |  | 200° C. | 4.09 | 4.84 | 7.03 | 7.91 | 8.01 |
|  | Lateral direction | 105° C. | 0.00 | 0.00 | 0.00 | 0.01 | 0.01 |
|  |  | 150° C. | 0.01 | 0.18 | 0.92 | 0.98 | 0.95 |
|  |  | 200° C. | 0.85 | 0.99 | 5.55 | 6.03 | 5.98 |
| (Contact angle of X surface)/(Contact angle of Y surface) |  |  | >1.1 | >1.1 | ≦1.1 | ≦1.1 | ≦1.1 |
| Resolution (μm) |  |  | 15 | 20 | 20 | 20 | 30 |
| Adhesive property (μm) |  |  | 15 | 15 | 20 | 20 | 25 |
| Side wall flatness of a resist pattern |  |  | Shallow | Shallow | Deep | Deep | Deep |

Example 3

The photosensitive element prepared in Example 1 was laminated on a copper-clad laminated board (MCL-E-61, trade name, available from Hitachi Chemical Co., Ltd.) which is a glass epoxy material on which copper foils (a thickness: 35 μm) had been laminated on the both surfaces thereof in the same manner as in Example 1. Next, exposure was carried out in the same manner as in Example 1 in such an energy dose that the number of remaining step after development became 8.0 by using a linear negative pattern (having an window which transmits active light with a size of 100 μm×1 cm) as a negative material.

When the unevenness on the center line (a length: 4 mm) of the side surface of the resulting resist pattern was measured by a Profile Measurement Microscope (VF-7500, trade name, manufactured by Keyence, Japan), the deepest unevenness was 0.9 μm. Also, when a mathematical average roughness ($R_a$) and a maximum height ($R_y$) on the center line (a length: 4 mm) of the side surface of the resulting resist pattern were measured (a cut-off value: $\lambda_c$=0.8 mm, an evaluation length $l_n$=4 mm) by the Profile Measurement Microscope (VF-7500, trade name, manufactured by Keyence, Japan), the results of $R_a$=0.3 μm and $R_y$=1.0 μm were obtained.

Example 4

A resist pattern was prepared in the same manner as in Example 3 except for using the photosensitive element prepared in Example 2 in place of that prepared in Example 1.

The deepest unevenness on the center line (a length: 4 mm) of the side surface of the resulting resist pattern was 1.0 μm. Also, a mathematical average roughness ($R_a$) and a maximum height ($R_y$) on the center line (a length: 4 mm) of the side surface of the resulting resist pattern were $R_a$=0.4 μm and $R_y$=1.0 μm, respectively.

Comparative Example 4

A resist pattern was prepared in the same manner as in Example 3 except for using the photosensitive element prepared in Comparative example 1 in place of that prepared in Example 1.

The deepest unevenness on the center line (a length: 4 mm) of the side surface of the resulting resist pattern was 5.0 μm, and the number of the unevenness larger than 3.0 μm was 8. Also, a mathematical average roughness ($R_a$) and a maximum height ($R_y$) on the center line (a length: 4 mm) of the side surface of the resulting resist pattern were $R_a$=2.3 μm and $R_y$=5.0 μm, respectively.

Comparative Example 5

A resist pattern was prepared in the same manner as in Example 3 except for using the photosensitive element prepared in Comparative example 2 in place of that prepared in Example 1.

The deepest unevenness on the center line (a length: 4 mm) of the side surface of the resulting resist pattern was 5.1 μm, and the number of the unevenness larger than 3.0 μm was 9. Also, a mathematical average roughness ($R_a$) and a maximum height ($R_y$) on the center line (a length: 4 mm) of the side surface of the resulting resist pattern were $R_a$=2.2 μm and $R_y$=5.1 μm, respectively.

Comparative Example 6

A resist pattern was prepared in the same manner as in Example 3 except for using the photosensitive element prepared in Comparative example 3 in place of that prepared in Example 1.

The deepest unevenness on the center line (a length: 4 mm) of the side surface of the resulting resist pattern was 5.5 μm, and the number of the unevenness larger than 3.0 μm was 7. Also, a mathematical average roughness ($R_a$) and a maximum height ($R_y$) on the center line (a length: 4 mm) of the side surface of the resulting resist pattern were $R_a$=2.3 μm and $R_y$=5.5 μm, respectively.

Example 5

The photosensitive element prepared in Example 1 was laminated on a copper-clad laminated board (MCL-E-61, trade name, available from Hitachi Chemical Co., Ltd.) which is a glass epoxy material in which copper foils (a thickness: 35 μm) had been laminated on the both surfaces thereof in the same manner as in Example 1. Then, exposure of the resulting material was carried out in the same manner as in Example 1 in such a manner that a linear wiring pattern (a width: 100 μm, a length: 1 cm, a height: a metal layer thickness of the substrate for forming a circuit) can be obtained with an energy dose that the number of remaining step after development became 8.0, followed by development and an etching treatment with a ferric chloride solution at 50° C.

When the unevenness on the center line (a length: 4 mm) of the side surface of the resulting resist pattern was measured by a Profile Measurement Microscope (VF-7500, trade name, manufactured by Keyence, Japan), the deepest unevenness was 0.9 μm. Also, when a mathematical average roughness ($R_a$) and a maximum height ($R_y$) on the center line (a length: 4 mm) of the side surface of the resulting resist pattern were measured (a cut-off value: $\lambda_c$=0.8 mm, an evaluation length $l_n$=4 mm) by the Profile Measurement Microscope (VF-7500, trade name, manufactured by Keyence, Japan), the results of $R_a$=0.3 μm and $R_y$=0.9 μm were obtained.

The resulting wiring pattern had good appearance and electric resistant characteristics thereof were also good.

Example 6

A resist pattern was prepared in the same manner as in Example 5 except for using the photosensitive element prepared in Example 2 in place of that prepared in Example 1.

The deepest unevenness on the center line (a length: 4 mm) of the side surface of the resulting resist pattern was 1.0 μm. Also, a mathematical average roughness ($R_a$) and a maximum height ($R_y$) on the center line (a length: 4 mm) of the side surface of the resulting resist pattern were $R_a$=0.4 μm and $R_y$=1.0 μm, respectively.

The resulting wiring pattern had good appearance and electric resistant characteristics thereof were also good.

Comparative Example 7

A resist pattern was prepared in the same manner as in Example 5 except for using the photosensitive element prepared in Comparative example 1 in place of that prepared in Example 1.

The deepest unevenness on the center line (a length: 4 mm) of the side surface of the resulting resist pattern was 5.0 μm, and the number of the unevenness larger than 3.0 μm was 8. Also, a mathematical average roughness ($R_a$) and a maximum height ($R_y$) on the center line (a length: 4 mm) of the side, surface of the resulting resist pattern were $R_a$=2.3 μm and $R_y$=5.0 μm, respectively.

The resulting wiring pattern was inferior in appearance to those obtained in Examples 5 and 6, and electric resistant characteristics thereof were also poor.

Comparative Example 8

A resist pattern was prepared in the same manner as in Example 5 except for using the photosensitive element prepared in Comparative example 2 in place of that prepared in Example 1.

The deepest unevenness on the center line (a length: 4 mm) of the side surface of the resulting resist pattern was 5.1 μm, and the number of the unevenness larger than 3.0 μm was 9. Also, a mathematical average roughness ($R_a$) and a maximum height ($R_y$) on the center line (a length: 4 mm) of the side surface of the resulting resist pattern were $R_a$=2.2 μm and $R_y$=5.1 μm, respectively.

The resulting wiring pattern was inferior in appearance to those obtained in Examples 5 and 6, and electric resistant characteristics thereof were also poor.

Comparative Example 9

A resist pattern was prepared in the same manner as in Example 5 except for using the photosensitive element prepared in Comparative example 3 in place of that prepared in Example 1.

The deepest unevenness on the center line (a length: 4 mm) of the side surface of the resulting resist pattern was 5.5 μm, and the number of the unevenness larger than 3.0 μm was 7. Also, a mathematical average roughness ($R_a$) and a maximum height ($R_y$) on the center line (a length: 4 mm) of the side surface of the resulting resist pattern were $R_a$=2.3 μm and $R_y$=5.5 μm, respectively.

The resulting wiring pattern was inferior in appearance to those obtained in Examples 5 and 6, and electric resistant characteristics thereof were also poor.

Example 7

A polyethylene film was laminated as a protective film on the photosensitive element obtained in Example 1, on the surface of a photosensitive resin composition layer, opposite to a support film. Next, the photosensitive element (a width: 55 cm, a length: 300 m) was wound around a core (a diameter: 8 cm, a length to the axis direction: 60 cm) so that the surface having the support film became outside to obtain a wound photosensitive element roll. The resulting photosensitive element roll was stored in an insulating container at 0° C. for 10 hours.

After storage in the insulating container, the photo-sensitive element roll was dropped five times from the height of 10 cm to a concrete surface (a collision surface) so that the axis direction of the core became perpendicular to the collision surface. Incidentally, dropping was successively carried out five times within one minute.

A total height of winding deviation at the edge surface of the photosensitive element roll after five times dropping was 0.5 mm.

Example 8

The same experiment as in Example 7 was carried out except for using the photosensitive element prepared in Example 2 in place of that prepared in Example 1.

A total height of winding deviation at the edge surface of the photosensitive element roll after five times dropping was 0.6 mm.

Comparative Example 10

The same experiment as in Example 7 was carried out except for using the photosensitive element prepared in Comparative example 1 in place of that prepared in Example 1.

A total height of winding deviation at the edge surface of the photosensitive element roll after five times dropping was 5.0 mm.

Comparative Example 11

The same experiment as in Example 7 was carried out except for using the photosensitive element prepared in Comparative example 2 in place of that prepared in Example 1.

A total height of winding deviation at the edge surface of the photosensitive element roll after five times dropping was 4.0 mm.

Comparative Example 12

The same experiment as in Example 7 was carried out except for using the photosensitive element prepared in Comparative example 3 in place of that prepared in Example 1.

A total height of winding deviation at the edge surface of the photosensitive element roll after five times dropping was 6.0 mm.

INDUSTRIAL APPLICABILITY

The photosensitive element of the present invention is excellent in side wall flatness of a resist pattern, flatness on an upper surface of the same, resolution, adhesiveness, alkaline developability, productivity and operatability, and having less number of mouse bites.

The photosensitive element of the present invention is excellent in side wall flatness of a resist pattern, in addition to the above effects.

The photosensitive element of the present invention is excellent in resolution, in addition to the above effects.

The photosensitive element of the present invention is excellent in dimensional stability at the time of lamination in addition to the above effects.

The photosensitive element of the present invention is excellent in film strength after hardening the resist in addition to the above effects.

The photosensitive element of the present invention is excellent in peeling property in addition to the above effects.

The photosensitive element of the present invention is excellent in cold flow property at storage in addition to the above effects.

The photosensitive element roll of the present invention is excellent in side wall flatness of a resist pattern, flatness on an upper surface of the same, resolution, adhesiveness, alkaline developability, winding deviation during shipping, productivity and operatability, and having less number of mouse bites.

The photosensitive element roll of the present invention is excellent in side wall flatness of a resist pattern, flatness on an upper surface of the same, resolution, adhesiveness, winding deviation during shipping, productivity and operatability, and having less number of mouse bites.

The process for preparing a resist pattern of the present invention is excellent in sidewall flatness of a resist pattern, flatness on an upper surface of the same, resolution, adhesiveness, productivity and operatability, and having less number of mouse bites.

The resist pattern of the present invention is excellent in side wall flatness of a resist pattern, flatness on an upper surface of the same, resolution, adhesiveness,productivity and operatability, and having less number of mouse bites.

The resist pattern laminated substrate of the present invention is excellent in side wall flatness of a resist pattern, flatness on an upper surface of the same, resolution, adhesiveness, productivity and operatability, and having less number of mouse bites.

The process for preparing a wiring pattern of the present invention is excellent in side wall flatness of a resist pattern, electric resistance and appearance of lines.

The wiring pattern of the present invention is excellent in side wall flatness of a resist pattern, electric resistance and appearance of lines.

The invention claimed is

1. A photosensitive element comprising a support film which comprises a biaxially oriented polyester film and a photosensitive resin composition layer formed on one surface of the polyester film, wherein a resin layer containing fine particles is formed on the opposite surface of the support film to which the photosensitive resin composition layer is formed, a haze of the support film is 0.01 to 2.0%, and a thickness of the photosensitive resin composition layer is 1 to 30 μm, said photosensitive resin composition comprises:
   (A) a binder polymer having a carboxyl group,
   (B) a photopolymerizable compound having at least one polymerizable ethylenically unsaturated group in the molecule, which mainly comprises a bisphenol A type (meth) acrylate compound, and
   (C) a photopolymerization initiator including a 2,4,5-triaryl imidazole dimer.

2. The photosensitive element according to claim 1, wherein an average particle size of the fine particles is 0.01 to 5.0 μm.

3. The photosensitive element according to claim 1, wherein a thickness of the resin layer containing fine particles is 0.05 to 5.0 μm.

4. The photosensitive element according to claim 1, wherein a heat shrinkage ratio in the longitudinal direction of the support film at 105° C. for 30 minutes is 0.30 to 0.60%.

5. The photosensitive element according to claim 1, wherein a heat shrinkage ratio in the longitudinal direction of the support film at 150° C. for 30 minutes is 1.00 to 1.90%.

6. The photosensitive element according to claim 1, wherein a heat shrinkage ratio in the longitudinal direction of the support film at 200° C. for 30 minutes is 3.00 to 6.50%.

7. The photosensitive element according to claim 1, wherein a weight average molecular weight of (A) the binder polymer having a carboxyl group is 20,000 to 300,000.

8. The photosensitive element according to claim 1, wherein an acid value of (A) the binder polymer having a carboxyl group is 50 to 300 mg KOH/g.

9. The photosensitive element according to claim 1, wherein formulation amounts of Components (A), (B) and (C) are
   40 to 80 parts by weight of Component (A) based on 100 parts by weight of Component (A) and Component (B) in total,
   20 to 60 parts by weight of Component (B) based on 100 parts by weight of Component (A) and Component (B) in total, and
   0.01 to 20 parts by weight of Component (C) based on 100 parts by weight of Component (A) and Component (B) in total.

10. A photosensitive element roll comprising a photosensitive element according to claim 1, wherein the photosensitive element is wound up or rolled around a core.

11. The photosensitive element according to claim 1, wherein the thickness of the photosensitive resin composition layer is 1 to 20 μm.

12. The photosensitive element according to claim 1, wherein when the photosensitive element is used to form a resist pattern, the unevenness on a side wall of the resist pattern formed is 0 to 3 μm.

13. A photosensitive element having a layer of a photosensitive resin composition on a support film, which comprises having a heat shrinkage ratio in the lateral direction of the support film at 200° C. for 30 minutes being 0.00 to 4.00%, and said photosensitive resin composition comprises:
   (A) a binder polymer having a carboxyl group,
   (B) a photopolymerizable compound having at least one polymerizable ethylenically unsaturated group in the molecule which mainly comprises a bisphenol A type (meth)acrylate compound, and
   (C) a photopolymerization initiator including a 2,4,5-triaryl imidazole dimer; and wherein the support film is a support film comprising a resin layer containing fine particles being laminated on one surface of a biaxially oriented polyester film, and the photosensitive resin composition layer is coated and dried on the opposite surface of the support film to which the resin layer is formed.

14. The photosensitive element according to claim 13, wherein the heat shrinkage ratio in the lateral direction of the support film at 150 ° C. for 30 minutes is 0.00 to 0.20%.

15. The photosensitive element according to claim 13, wherein the heat shrinkage ratio in the lateral direction of the support film at 105° C. for 30 minutes is 0.00 to 0.20%.

16. The photosensitive element according to claim 13, wherein when the photosensitive element is used to form a resist pattern, the unevenness on a side wall of the resist pattern formed is 0 to 3 μm.

17. A photosensitive element having a layer of a photosensitive resin composition on a support film, which comprises having a heat shrinkage ratio in the lateral direction of the support film at 150° C. for 30 minutes being 0.00 to 0.20%, and a thickness of the photosensitive resin composition layer is 1 to 30 μm, said photosensitive resin composition comprises:
    (A) a binder polymer having a carboxyl group,
    (B) a photopolymerizable compound having at least one polymerizable ethylenically unsaturated group in the molecule which mainly comprises a bisphenol A type (meth)acrylate compound, and
    (C) a photopolymerization initiator including a 2,4,5-triaryl imidazole dimer; and wherein the support film is a support film comprising a resin layer containing fine particles being laminated on one surface of a biaxially oriented polyester film, a haze of the support film is 0.01 to 2.0%, and the photosensitive resin composition layer is coated and dried on the opposite surface of the support film to which the resin layer is formed.

18. The photosensitive element according to claim 17, wherein the heat shrinkage ratio in the lateral direction of the support film at 105° C. for 30 minutes is 0.00 to 0.20%.

19. The photosensitive element according to claim 17, wherein when the photosensitive element is used to form a resist pattern, the unevenness on a side wall of the resist pattern formed is 0 to 3 μm.

20. A photosensitive element having a layer of a photosensitive resin composition on a support film, wherein a contact angle (°) of the support film with water satisfies the following numerical formula (1):

(Contact angle at $X$ surface)/(Contact angle at $Y$ surface)<1.1  (1)

wherein X surface means a surface of the support film to which the photosensitive resin composition is coated and dried; and Y surface means a surface of the support film opposite to the surface to which the photosensitive resin composition is coated,
    and a thickness of the photosensitive resin composition layer is 1 to 30 μm, said photosensitive resin composition comprises
    (A) a binder polymer having a carboxyl group,
    (B) a photopolymerizable compound having at least one polymerizable ethylenically unsaturated group in the molecule which mainly comprises a bisphenol A type (meth)acrylate compound, and
    (C) a photopolymerization initiator including a 2,4,5-triaryl imidazole dimer; and
        wherein the support film is a support film comprising a resin layer containing fine particles being laminated on one surface of a biaxially oriented polyester film, a haze of the support film is 0.01 to 2.0%, and the photosensitive resin composition layer is coated and dried on the opposite surface of the support film to which the resin layer is formed.

21. The photosensitive element according to claim 20, wherein when the photosensitive element is used to form a resist pattern, the unevenness on a side wall of the resist pattern formed is 0 to 3 μm.

22. A process for preparing a resist pattern which comprises the steps of:
    laminating a photosensitive element to a substrate for forming a circuit so that the photosensitive resin composition layer is closely contacted to the substrate, wherein the photosensitive element comprises a support film which comprises a biaxially oriented polyester film and a photosensitive resin composition layer formed on one surface of the polyester film, wherein a resin layer containing fine particles is formed on the opposite surface of the support film to which the photosensitive resin composition layer is formed, a haze of the support film is 0.01 to 2.0%, and a thickness of the photosensitive resin composition layer is 1 to 30 μm, said photosensitive resin composition comprises:
    (A) a binder polymer having a carboxyl group,
    (B) a photopolymerizable compound having at least one polymerizable ethylenically unsaturated group in the molecule, which mainly comprises a bisphenol A type (meth) acrylate compound, and
    (C) a photopolymerization initiator including a 2,4,5-triaryl imidazole dimer;
    irradiating imagewisely active light to photocure the exposed portion; and removing an unexposed portion by development.

23. A process for preparing a wiring pattern comprising the steps of:
    (a) preparing a resist pattern by
        i. laminating a photosensitive element to a substrate for forming a circuit so that the photosensitive resin composition layer is closely contacted to the substrate, wherein the photosensitive element comprises a support film which comprises a biaxially oriented polyester film and a photosensitive resin composition layer formed on one surface of the polyester film, wherein a resin layer containing fine particles is formed on the opposite surface of the support film to which the photosensitive resin composition layer is formed, a haze of the support film is 0.01 to 2.0%, and a thickness of the photosensitive resin composition layer is 1 to 30 μm, said photosensitive resin composition comprises:
        (A) a binder polymer having a carboxyl group,
        (B) a photopolymerizable compound having at least one polymerizable ethylenically unsaturated group in the molecule, which mainly comprises a bisphenol A type (meth) acrylate compound, and
        (C) a photopolymerization initiator including a 2,4,5-triaryl imidazole dimer;
        ii. irradiating imagewisely active light to photocure the exposed portion; and
        iii. removing an unexposed portion by development, wherein unevenness on the side surface of the resist pattern is 0 to 3.0 μm;
    (b) preparing a resist pattern laminated substrate by forming the resist pattern on a substrate for preparing a circuit; and
    (c) subjecting the resist pattern laminated substrate to etching or plating.

* * * * *

UNITED STATES PATENT AND TRADEMARK OFFICE
CERTIFICATE OF CORRECTION

PATENT NO. : 7,592,124 B2 Page 1 of 1
APPLICATION NO. : 11/281371
DATED : September 22, 2009
INVENTOR(S) : Tatsuo Chiba et al.

It is certified that error appears in the above-identified patent and that said Letters Patent is hereby corrected as shown below:

Title Page, under the heading of "(75) Inventors:"

The spelling of the first inventor's name is mispelled as "Tasuo Chiba". The correct spelling of the inventor's name is --Tatsuo Chiba--.

Signed and Sealed this

Ninth Day of March, 2010

David J. Kappos
*Director of the United States Patent and Trademark Office*